(12) United States Patent
Lu

(10) Patent No.: US 12,557,265 B2
(45) Date of Patent: Feb. 17, 2026

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 796 days.

(21) Appl. No.: 17/878,397

(22) Filed: Aug. 1, 2022

(65) Prior Publication Data
US 2023/0081676 A1 Mar. 16, 2023

Related U.S. Application Data

(63) Continuation of application No. PCT/CN2022/070374, filed on Jan. 5, 2022.

(30) Foreign Application Priority Data

Sep. 16, 2021 (CN) .......................... 202111085578.8

(51) Int. Cl.
*H01L 27/108* (2006.01)
*H10B 12/00* (2023.01)

(52) U.S. Cl.
CPC .......... *H10B 12/30* (2023.02); *H10B 12/482* (2023.02); *H10B 12/485* (2023.02); *H10B 12/488* (2023.02)

(58) Field of Classification Search
CPC .... H10B 12/30; H10B 12/482; H10B 12/485; H10B 12/488; H10B 12/053
See application file for complete search history.

(56) References Cited

U.S. PATENT DOCUMENTS

| 2011/0073925 | A1 | 3/2011 | Park | |
|---|---|---|---|---|
| 2011/0129974 | A1 | 6/2011 | Eun | |
| 2021/0035613 | A1* | 2/2021 | Park | ...................... H10B 12/34 |

FOREIGN PATENT DOCUMENTS

| CN | 102034759 A | 4/2011 |
|---|---|---|
| CN | 108878424 A | 11/2018 |
| CN | 111786718 A | 10/2020 |
| CN | 112447605 A | 3/2021 |
| CN | 213401190 U | 6/2021 |
| CN | 113594097 A | 11/2021 |

* cited by examiner

*Primary Examiner* — Mohammed R Alam
(74) *Attorney, Agent, or Firm* — Syncoda LLC; Feng Ma

(57) ABSTRACT

Embodiments provide a method for forming a semiconductor structure and the semiconductor structure. The method includes: providing a base including bit line trenches extending in a first direction and arranged in a second direction; forming a bit line structure in each bit line trench; and etching the base with bit line structures formed therein to form active areas corresponding to the bit line structures. Each column of the active areas arranged in the first direction includes the active areas extending in a third direction, and the first direction, the second direction and the third direction are positioned in a same plane, and there is a first preset included angle between the second direction and the first direction and a second preset included angle between the third direction and the first direction.

13 Claims, 41 Drawing Sheets

METHOD FOR FORMING SEMICONDUCTOR STRUCTURE AND SEMICONDUCTOR STRUCTURE

CROSS REFERENCE TO RELATED APPLICATIONS

The present application is a continuation of International Patent Application No. PCT/CN2022/070374, filed on Jan. 5, 2022, which claims priority to Chinese Patent Application No. 202111085578.8, filed on Sep. 16, 2021. The aforementioned patent applications are incorporated herein by reference in their entirety.

BACKGROUND

A semiconductor device, e.g., a DRAM (Dynamic Random Access Memory), includes a plurality of memory cells, word lines (WLs), and bit lines (BLs). In the related art, the process for manufacturing WLs and BLs is complicated and is required to be improved.

SUMMARY

Embodiments of the disclosure provide a method for forming a semiconductor structure and the semiconductor structure.

In an aspect, embodiments of the disclosure provide a method for forming a semiconductor structure, including the following operations:
  providing a base including bit line trenches extending in a first direction and arranged in a second direction;
  forming a bit line structure in each bit line trench; and
  etching the base with bit line structures formed therein to form active areas corresponding to the bit line structures.

Each column of the active areas arranged in the first direction includes the active areas extending in a third direction, and the first direction, the second direction, and the third direction are positioned in a same plane, and there is a first preset included angle between the second direction and the first direction and a second preset included angle between the third direction and the first direction.

In another aspect, embodiments of the disclosure provide a semiconductor structure, including:
  a base;
  bit line structures formed in the base, the bit line structures extend in a first direction and are arranged in a second direction; and
  active areas corresponding to the bit line structures, with each column of the active areas arranged in the first direction including at least two active areas extending in a third direction.

The first direction, the second direction, and the third direction are positioned in a same plane, and there is a first preset included angle between the second direction and the first direction and a second preset included angle between the third direction and the first direction.

DETAILED DESCRIPTION

The disclosure relates to, but is not limited to a method for forming a semiconductor structure and the semiconductor structure.

The specific technical scheme of the disclosure will be described in further detail below with reference to the drawings according to the embodiments of the disclosure. The following embodiments are merely used to illustrate the technical scheme of the disclosure and are not intended to limit the scope of the disclosure.

Formation of a semiconductor structure in the related art will be illustrated with reference to FIG. 1A to FIG. 1E.

Figure 1A:
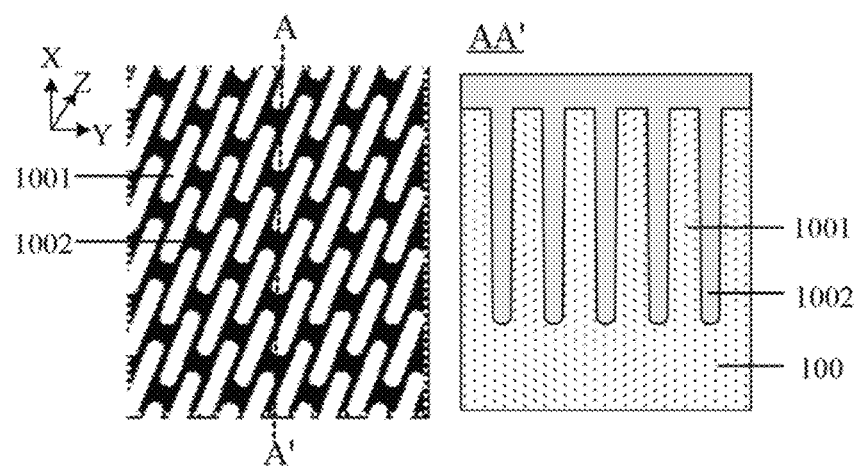
FIG. 1A illustrates a schematic structural diagram of forming a semiconductor structure in the related art.

With reference to FIG. 1A, a substrate 100 is provided, the substrate 100 is etched by a preset thickness, a plurality of semiconductor columns spaced in an AA' direction are formed in the substrate 100, and isolation trenches are formed among the semiconductor columns. The height direction of the semiconductor columns is the thickness direction of the substrate. The semiconductor columns subsequently form a plurality of active areas 1001. Each active area 1001 is a strip-shaped column extending in a third direction (Z-axis direction) and is configured to form an active device such as a transistor. Silicon dioxide is deposited between active areas 1001 and on the surface of each active area 1001 as an isolation region 1002 configured to isolate the active areas 1001 to form a plurality of active devices.

Figure 1B:
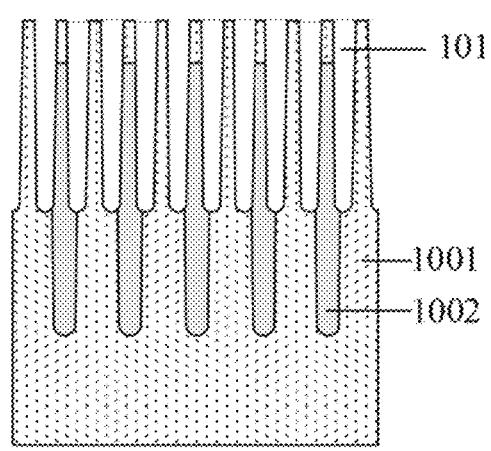
FIG. 1B illustrates a schematic structural diagram of forming a semiconductor structure in the related art.

With reference to FIG. 1B, the active areas 1001 and isolation region 1002 are etched to form a plurality of word line trenches 101 parallel to each other. The word line trenches 101 extend in a second direction (Y-axis direction) and are arranged in a first direction (X-axis direction).

Figure 1C:
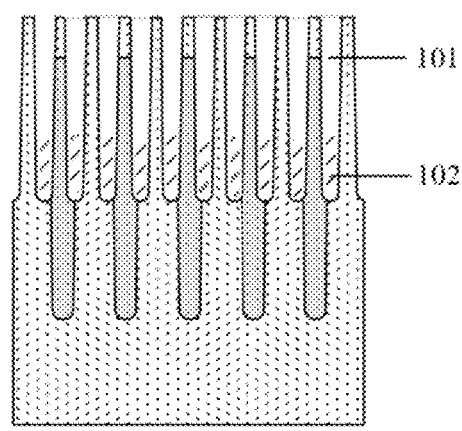
FIG. 1C illustrates a schematic structural diagram of forming a semiconductor structure in the related art.

With reference to FIG. 1C, a word line structure 102 is formed in each word line trench 101.

Figure 1D:
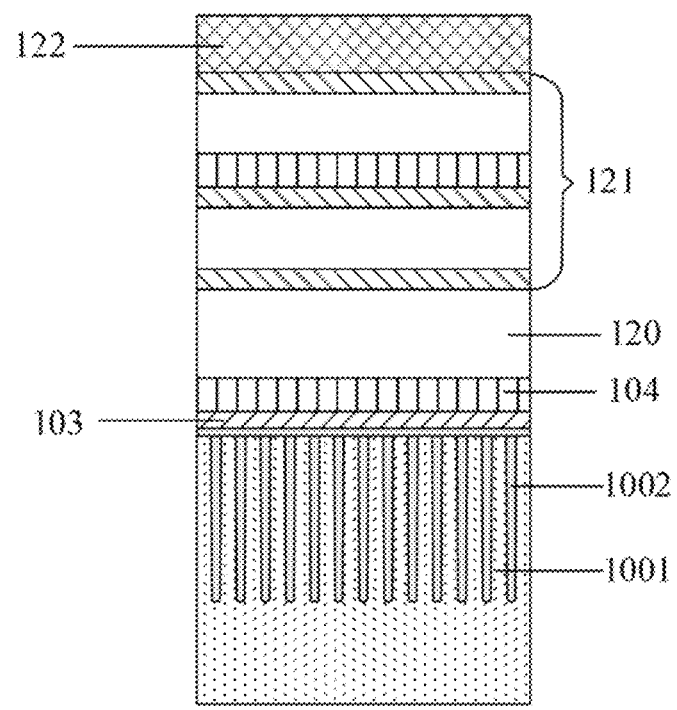
FIG. 1D illustrates a schematic structural diagram of forming a semiconductor structure in the related art.
Figure 1E:
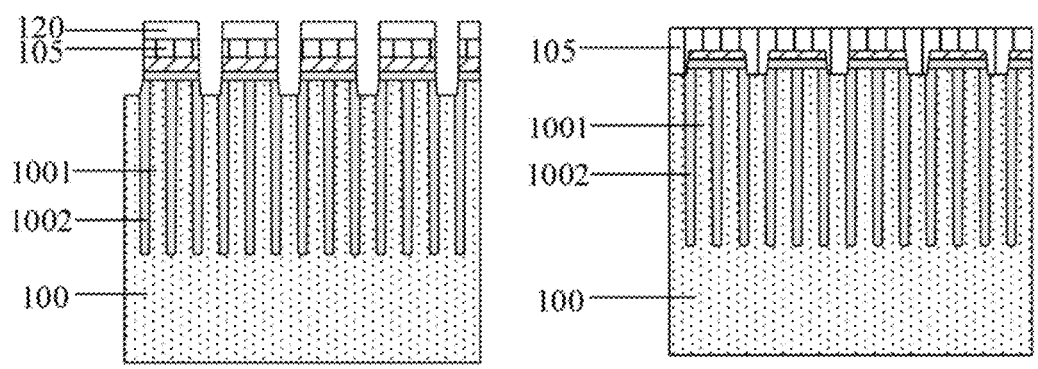
FIG. 1E illustrates a schematic structural diagram of forming a semiconductor structure in the related art.

With reference to FIG. 1D, a first isolation layer 103, a conductive layer 104, a first insulating layer 120, a first mask layer 121, and a first photoresist layer 122 are sequentially formed on the surfaces of each word line structure 102, etched active area 1001, and etched isolation region 1002. The first mask layer 121 is patterned with the first photoresist layer 122, and the first isolation layer 103, the conductive layer 104, and the first insulating layer 120 are etched by utilizing the patterned first mask layer 121. The first mask layer 121 may be a multi-layer structure, e.g., the first mask layer 121 may include a hard mask layer, a barrier layer, and an insulating layer stacked sequentially.

With reference to FIG. 1B, the left panel and the right panel shown in FIG. 1B illustrate different cross-sectional diagrams of a same structure. The conductive layer 104 is etched to form a first bit line contact layer 105. The first insulating layer 120 is configured to protect a conductive material below the first insulating layer 120 from contamination when the conductive layer 104 is etched to form the first bit line contact layer 105, and the first insulating layer 120 is removed after the conductive layer 104 is etched to form the first bit line contact layer 105.

Figure 1F:
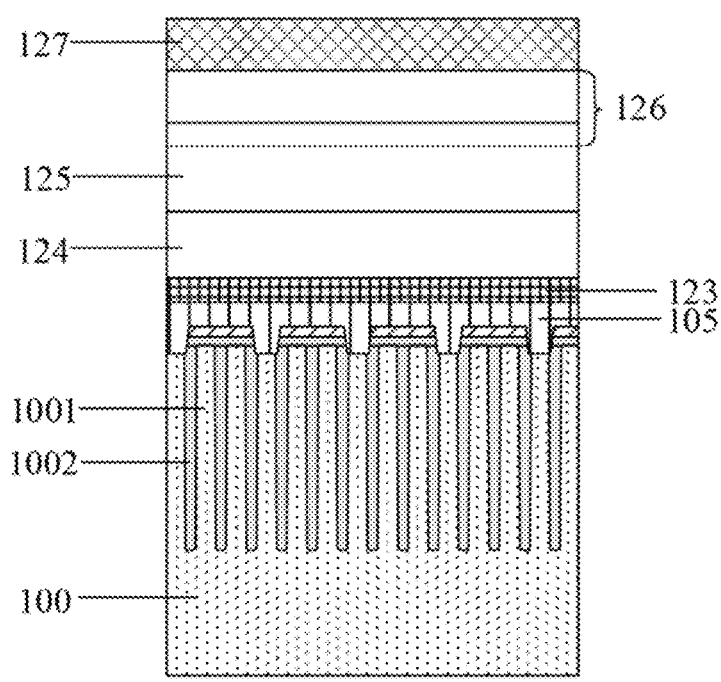
FIG. 1F illustrates a schematic structural diagram of forming a semiconductor structure in the related art.
Figure 1G:
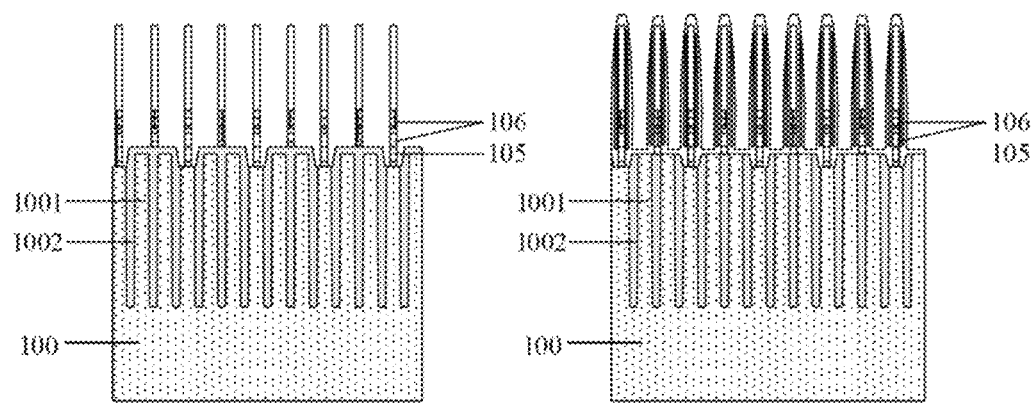
FIG. 1G illustrates a schematic structural diagram of forming a semiconductor structure in the related art.

With reference to FIG. 1F and FIG. 1G, a metal conductive layer 123, a second isolation layer 124, an Amorphous Carbon Layer (ACL) 125, a second mask layer 126, and a second photoresist layer 127 are sequentially formed on the bit line contact layer 105. The second mask layer 126 is patterned with the second photoresist layer 127, and the metal conductive layer 123, the second isolation layer 124, and the bit line contact layer 105 are etched by utilizing the patterned second mask layer 126. The etched metal conductive layer 123 and the etched first bit line contact layer 105 form a plurality of bit line structures 106 parallel to each other, and the etched second isolation layer 124 forms a third isolation layer.

Due to the fact that parasitic capacitance would be generated among the plurality of bit line structures 106, especially between adjacent bit line structures 106, filling of silicon nitride on the bottom of each bit line structure 106 to form a Nitride-Oxide-Nitride (N—O—N) structure on the sidewalls of the bit line structure 106 is required.

For this reason, the process for manufacturing the semiconductor structure is relatively complicated.

Figure 2A:
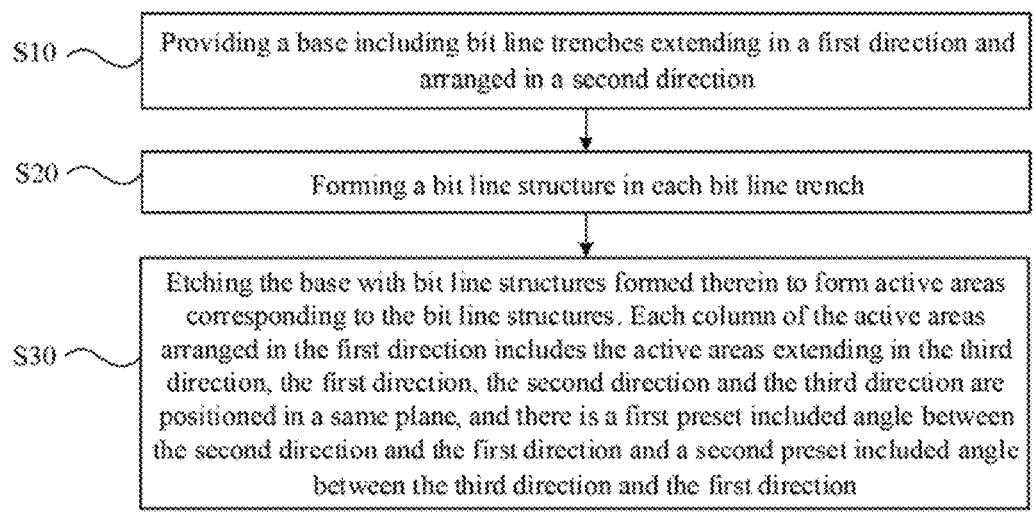
FIG. 2A illustrates a schematic flowchart of a method for forming a semiconductor structure according to embodiments of the disclosure.

To solve the foregoing problems, with reference to FIG. 2A, embodiments of the disclosure provide a method for forming a semiconductor structure, including the following operations.

At S10, a base including bit line trenches is provided; the bit line trenches extend in a first direction and are arranged in a second direction.

The base may be a silicon base, and may further include another semiconductor element, e.g., germanium (Ge), or another semiconductor compound, e.g., silicon carbide (SIC), gallium arsenide (GaAs), gallium phosphide (GaP), indium phosphide (InP), indium arsenide (InAs), or indium antimonide (InSb), or another semiconductor alloy, e.g., silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP) or any combination thereof.

Herein, the base may include a top surface in the front side and a bottom surface in the back side opposite to the front side. A direction perpendicular to the top surface and the bottom surface of the base is defined as a fourth direction, regardless the flatness of the top surface and the bottom surface. In the direction of the top surface and the bottom surface of the base, a first direction and a second direction intersecting each other (e.g., perpendicular to each other) are defined. To facilitate the description, according to the embodiments of the disclosure, a direction in which a plurality of bit line trenches are arranged is defined as the second direction, and a direction in which the bit line trenches extend is defined as the first direction. Based on the first direction and second direction, a direction of the plane in which the base is positioned can be determined. According to the embodiments of the disclosure, the plane in which the first direction and the second direction are positioned is defined as a horizontal plane, there is certain included angle between the first direction and the second direction, the third direction is positioned between the first direction and the second direction, and the first direction, the second direction, and the third direction are in a same plane. To facilitate the understanding, the first direction may be understood as an X-axis direction, the second direction may be understood as a Y-axis direction, the third direction may be understood as a Z-axis direction, and the fourth direction may be understood as a U-axis direction, e.g., the thickness direction of the base.

Herein, each bit line trench has a preset depth, the depth direction of the bit line trenches is the thickness direction of the base, i.e., the fourth direction (U direction), and the preset depth of each bit line trench is smaller than the thickness of the base.

At S20, a bit line structure is formed in each bit line trench.

Herein, a bit line structure may be completely positioned in the corresponding bit line trench, or partial bit line structure may be positioned in the corresponding bit line trench, i.e., partial top surface of a bit line structure is higher than the top surface of the base.

Herein, each bit line structure is configured to be electrically connected to an active area in a semiconductor device. Each bit line structure may be a single-layer structure or a multi-layer composite structure, and each bit line structure may include a bit line metal layer, the material of which may include tungsten (W), cobalt (Co), copper (Cu), aluminum (Al), polysilicon, doped silicon, silicide, or any combination thereof.

At S30, the base with bit line structures formed therein is etched to form active areas corresponding to the bit line structures. Each column of active areas arranged in the first direction include active areas extending in the third direction, the first direction, the second direction and the third direction are positioned in a same plane, and there is a first preset included angle between the second direction and the first direction and a second preset included angle between the third direction and the first direction.

Herein, wet etching, dry etching or other suitable etching processes, e.g., plasma etching, reactive ion etching, etc., may be adopted. The first preset included angle and the second preset included angle may be smaller than 90 degrees.

The foregoing steps S10 to S30 will be illustrated below with reference to FIG. 2B to FIG. 2D. First, with reference to FIG. 2B, S10 is implemented to provide a base 20. The base 20 includes at least two bit line trenches 201 extending in the X-axis direction and arranged in the Y-axis direction; and the at least two bit line trenches 201 are parallel to each other. With reference to FIG. 2C, S20 is implemented to form a bit line structure 202 in each bit line trench 201. Adjacent bit line structures 202 are parallel to each other in the X-axis direction and arranged in the Y-axis direction.

Figure 2B:
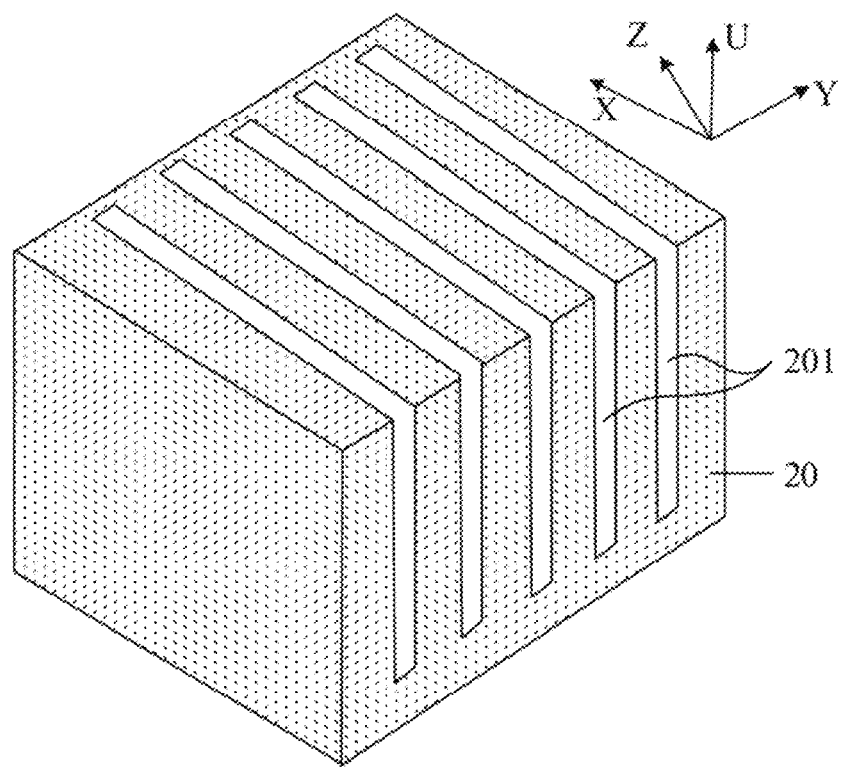
FIG. 2B illustrates a schematic structural diagram of forming a semiconductor structure according to embodiments of the disclosure.
Figure 2C:
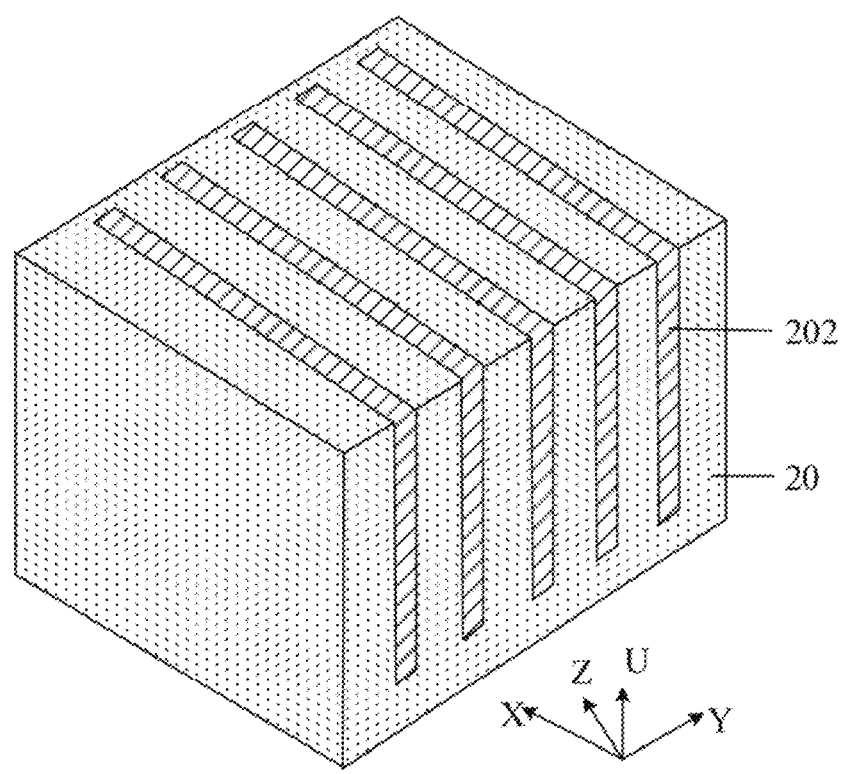
FIG. 2C illustrates a schematic structural diagram of forming a semiconductor structure according to embodiments of the disclosure.
Figure 2D:
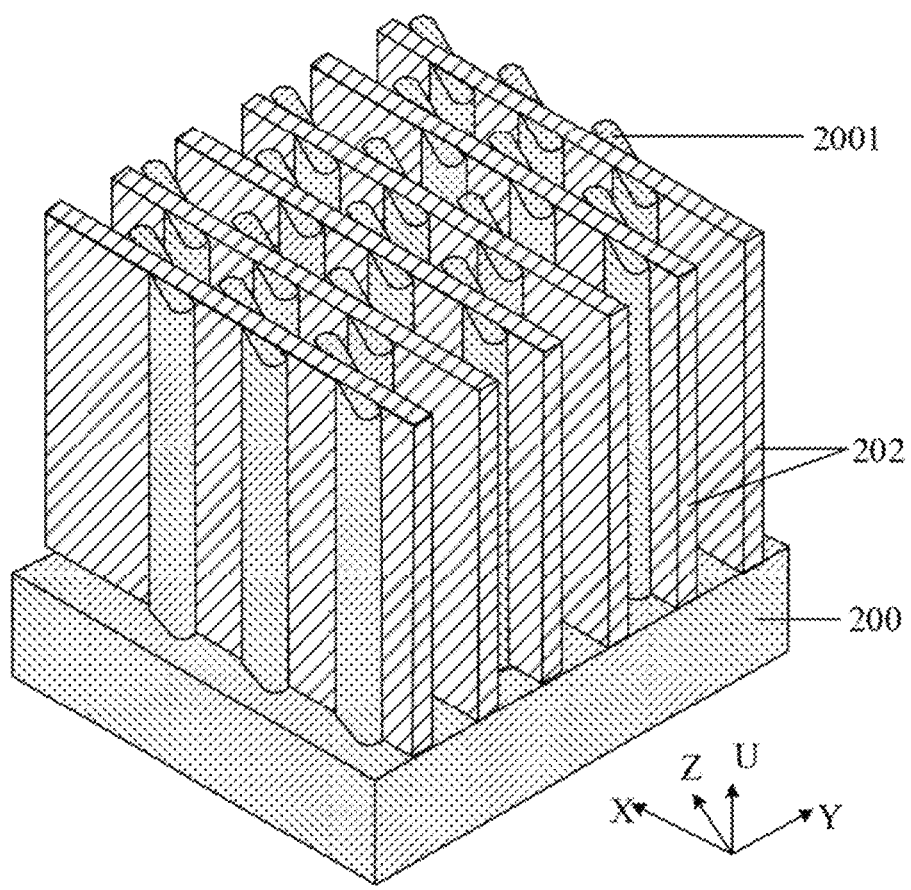
FIG. 2D illustrates a schematic structural diagram of forming a semiconductor structure according to embodiments of the disclosure.

Next, with reference to FIG. 2D, S30 is implemented to etch the base 20 with bit line structures 202 formed therein to form active areas 2001 corresponding to the bit line structures 202. A plurality of active areas 2001 extend in the Z-axis direction, and each bit line structure 202 corresponds to a column of active areas 2001, and each column of active areas 2001 include at least two spaced active areas 2001.

Therefore, the rest base after being etched in S30 may be defined as a substrate 200, and the depth of the bit line trenches 201 may be the height of the bit line structures 202. Meanwhile, each active area 2001 is divided into two portions by a corresponding bit line structure 202, which may be configured to be a source region/drain region of a semiconductor device to form a transistor, and each bit line structure 202 is electrically connected to the source region/drain region of the corresponding transistor.

In implementing the method, the source/drain region and the substrate 200 may be different in conductivity, e.g., the source/drain region may be an N-type semiconductor and the substrate 200 may be a P-type semiconductor.

Figure 2E:
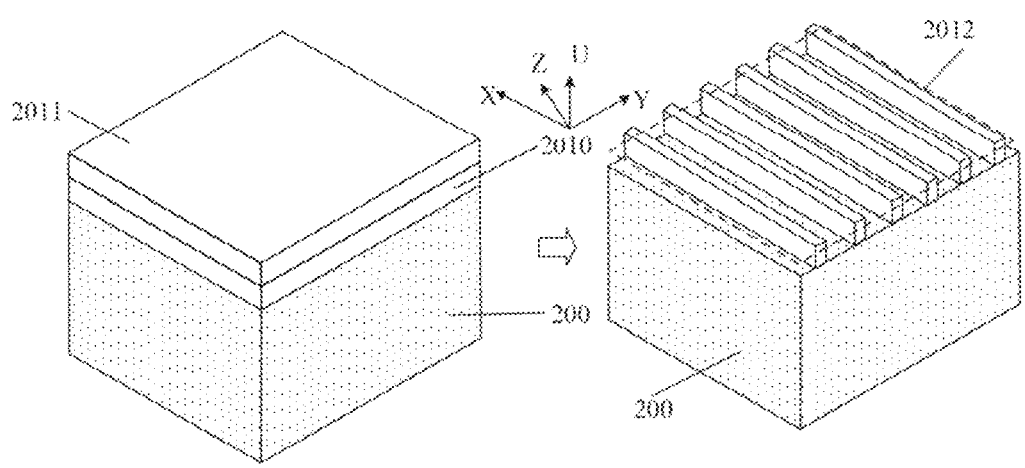
FIG. 2E illustrates a schematic structural diagram of forming a semiconductor structure according to embodiments of the disclosure.

According to some embodiments, with reference to FIG. 2E, a method for forming a base 20 includes at least the following operations:

providing a substrate 200, and sequentially forming a first mask layer 2010, and a first photoresist layer 2011 on the substrate 200, patterning the first mask layer 2010 with the first photoresist layer 2011 to form a bit line pattern 2012 exposing partial surface of the substrate 200 corresponding to each bit line trench 201; and etching the substrate 200 by utilizing the bit line pattern 2012 to form the base 20 including bit line trenches 201 extending in the X-axis direction and arranged in the Y-axis direction.

Herein, the substrate may be a silicon substrate, Silicon-On-Insulator (SOI) substrate, germanium substrate, Germanium-On-Insulator (GeOD) substrate, silicon germanium substrate, or epitaxial film substrate obtained through a selective epitaxial growth process. Dry etching or wet etching may be adopted.

According to the embodiments of the disclosure, the bit line structures are formed in the base including the bit line trenches, and then, the base is etched to form the active areas, thereby providing the method for forming the semiconductor structure different from that in the related art. In the related art, active areas are formed first and then bit line structures are formed. According to the technical scheme according to the embodiments of the disclosure, the bit line structures are formed first and then the active areas are formed. Therefore, according to the technical scheme according to the embodiments of the disclosure, filling and a plurality of etching processes are not required, thereby simplifying the process for forming the semiconductor structure.

A semiconductor structure shown in FIG. 2D is formed based on the method for forming the semiconductor structure shown in FIG. 2A, and the semiconductor structure includes:
- a base;
- bit line structures 202 formed in the base and extending in a first direction (X-axis direction) and arranged in a second direction (Y-axis direction); and
- active areas 2001 corresponding to the bit line structures 202, with each column of active areas 2001 arranged in the first direction including at least two active areas 2001 extending in a third direction (Z-axis direction).

The first direction, the second direction and the third direction are positioned in a same plane, and there is a first preset included angle between the second direction and the first direction and a second preset included angle between the third direction and the first direction.

Figure 3A:
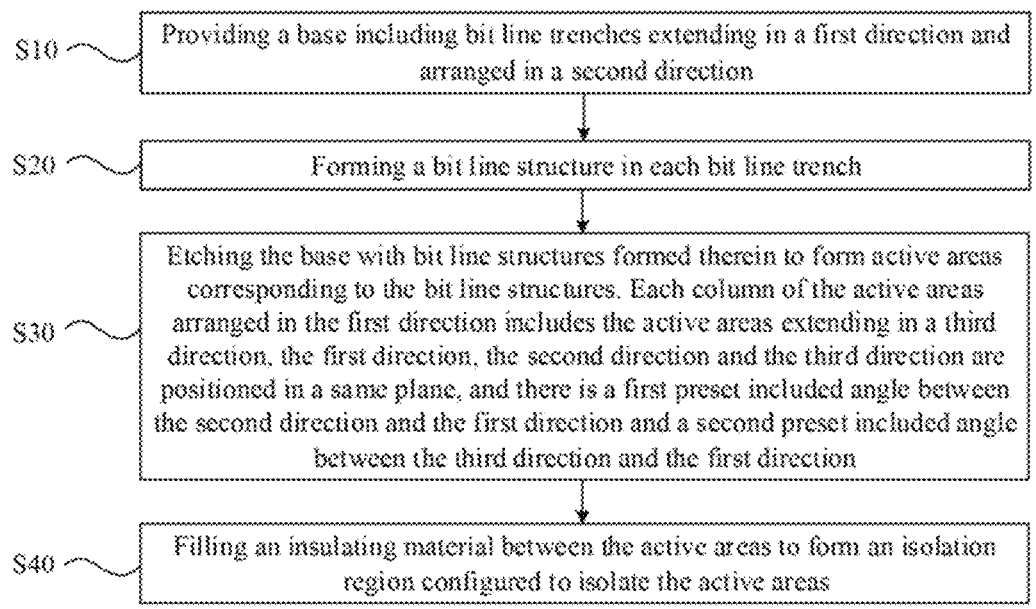
FIG. 3A illustrates another schematic flowchart of a method for forming a semiconductor structure according to embodiments of the disclosure.

Embodiments of the disclosure provide a method for forming a semiconductor structure. With reference to FIG. 3A, the method, after S30, further includes step S40 including: filling an insulating material between active areas to form an isolation region configured to isolate the active areas.

Herein, the insulating material may include one or more of silicon oxides, and the insulating material may be formed through any suitable deposition process, e.g., a Chemical Vapor Deposition (CVD) process, Physical Vapor Deposition (PVD) process, Atomic Layer Deposition (ALD) process, etc. The isolation region may be configured to be a Shallow Trench Isolation (STI) region.

S40 will be illustrated below with reference to FIG. 3B. An insulating material is deposited between active areas 2001 to form an isolation region 2002 featuring connectivity and configured to isolate the active areas 2001.

Figure 3B:
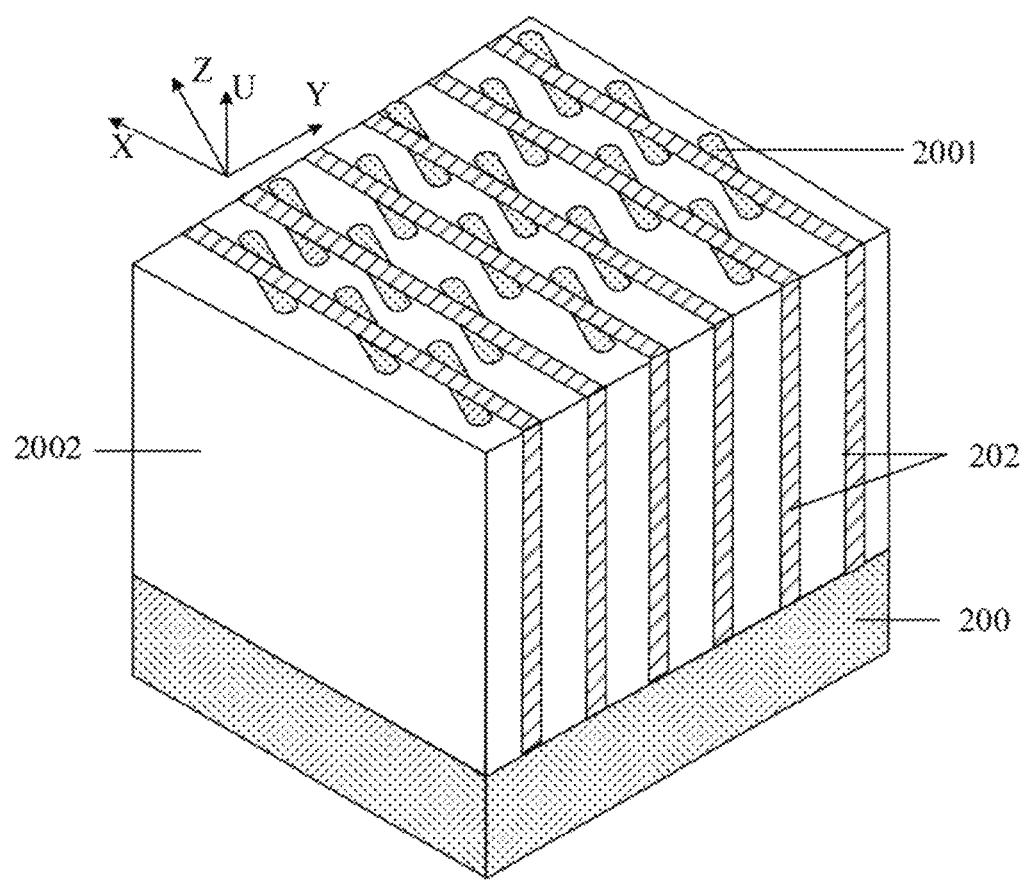
FIG. 3B illustrates a schematic structural diagram of forming a semiconductor structure according to embodiments of the disclosure.

A semiconductor structure shown in FIG. 3B is formed based on the method for forming the semiconductor structure shown in FIG. 3A. The semiconductor structure further includes an isolation region 2002 between active areas 2001 and configured to isolate the active areas 2001.

Figure 4A:
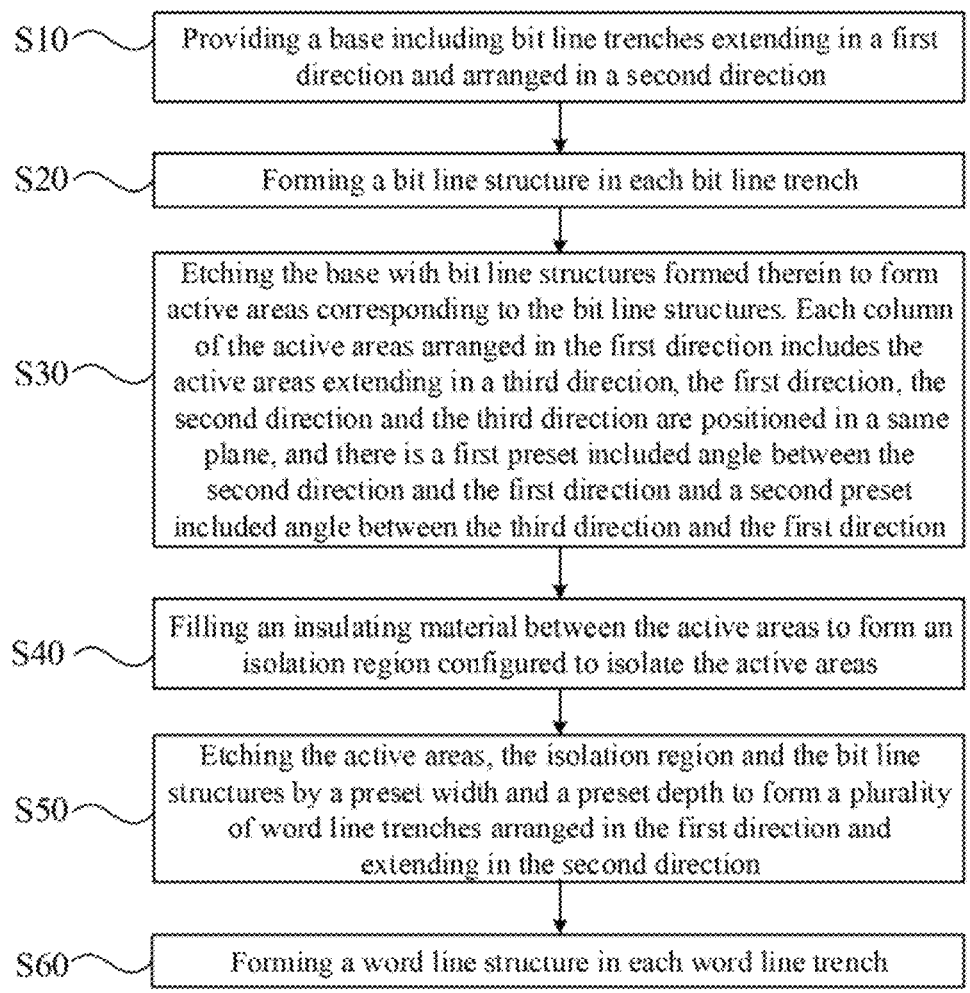
FIG. 4A illustrates another schematic flowchart of a method for forming a semiconductor structure according to embodiments of the disclosure.

According to some embodiments, with reference to FIG. 4A, a method for forming a semiconductor structure, after S40, further includes S50 and S60.

At S50, each active area, isolation region and bit line structure are etched by a preset width and a preset depth to form a plurality of word line trenches arranged in a first direction and extending in a second direction.

Herein, the preset depth may be smaller than the thickness of the base.

At S60, a word line structure is formed in each word line trench.

Herein, each word line structure may be embedded, and may include a conductive material, e.g., tungsten, cobalt, copper, aluminum, polysilicon, titanium nitride, or any combination thereof.

Figure 4B:
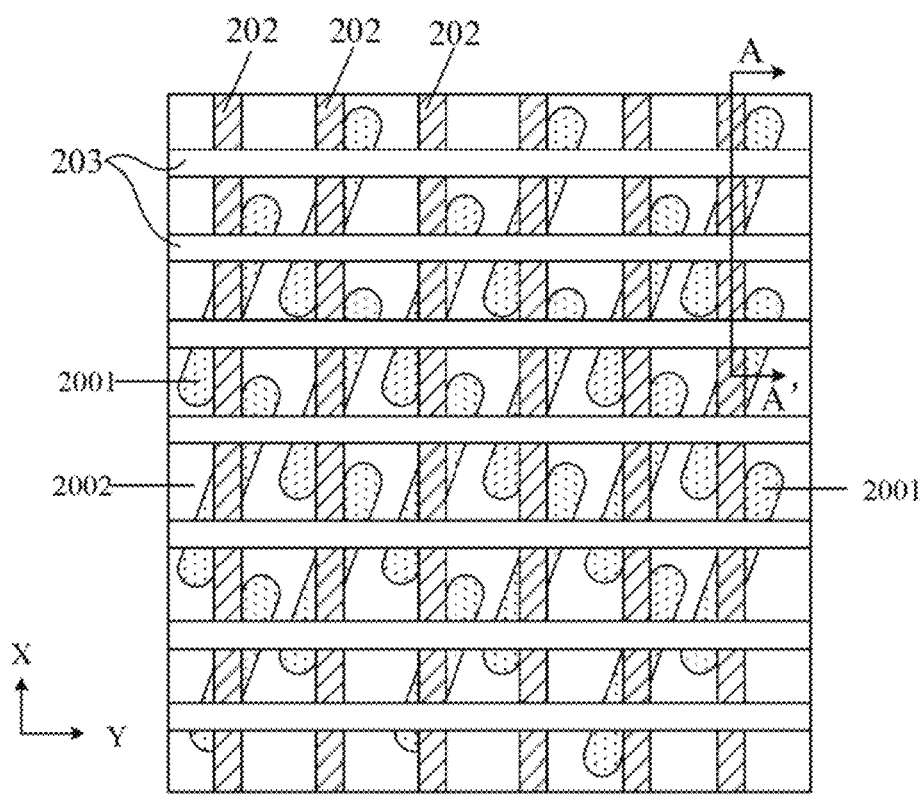
FIG. 4B illustrates a schematic structural diagram of forming a semiconductor structure according to embodiments of the disclosure.
Figure 4C:
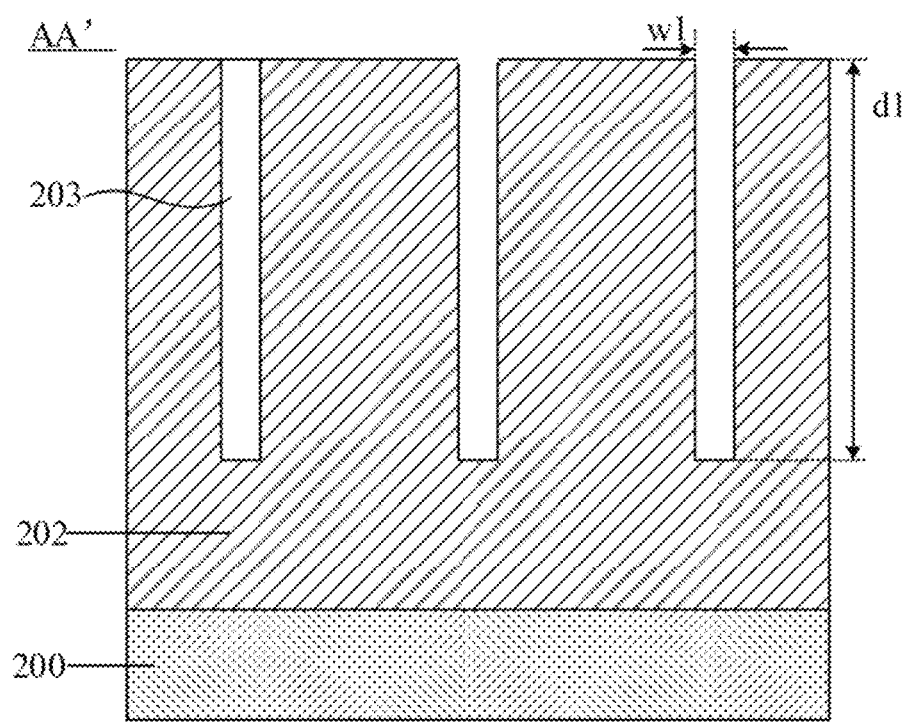
FIG. 4C illustrates a schematic structural diagram of forming a semiconductor structure according to embodiments of the disclosure.
Figure 4D:
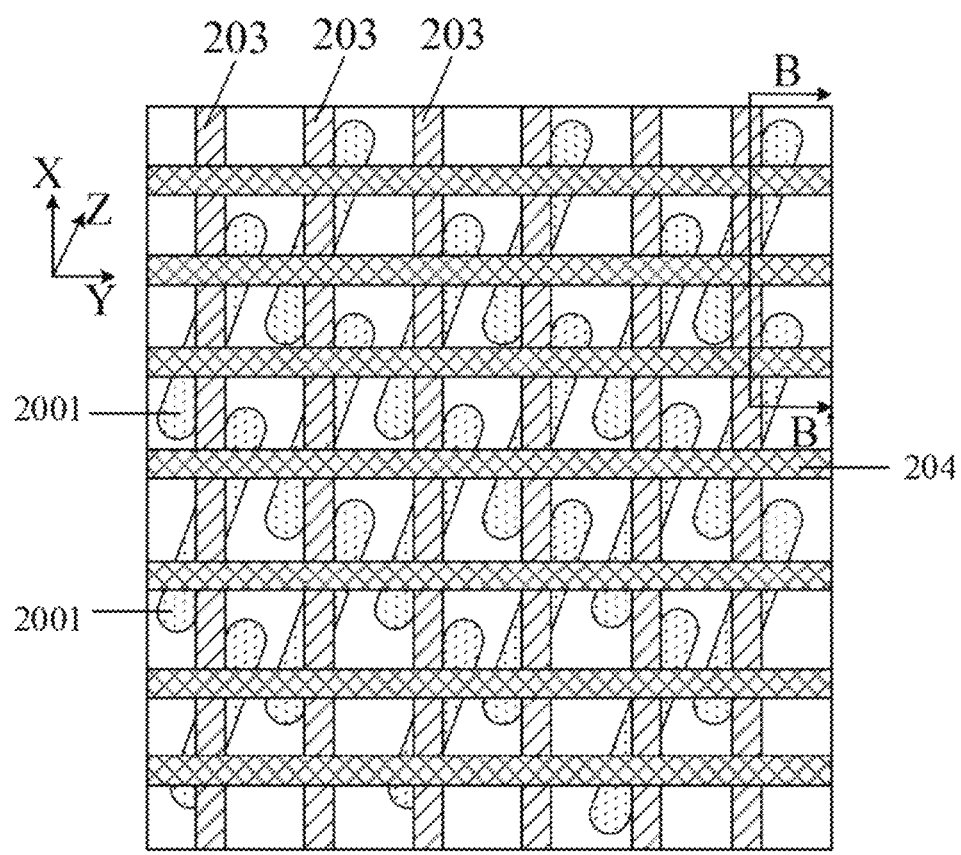
FIG. 4D illustrates a schematic structural diagram of forming a semiconductor structure according to embodiments of the disclosure.
Figure 4E:
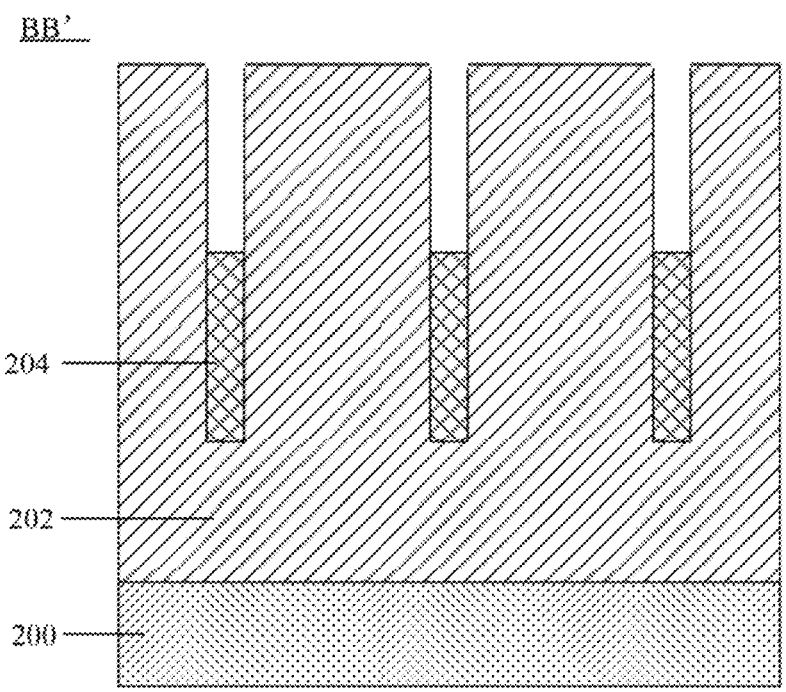
FIG. 4E illustrates a schematic structural diagram of forming a semiconductor structure according to embodiments of the disclosure.

The foregoing S50 and S60 will be illustrated below with reference to FIG. 4B to 4E. First, with reference to FIG. 4B and FIG. 4C, FIG. 4C illustrates a cross-sectional structural diagram of FIG. 4B along AA', S50 is implemented to etch each active area 2001, isolation region 2002, and bit line structure 202 to form a plurality of word line trenches 203 arranged in the X-axis direction and extending in the Y-axis direction. Each word line trench 203 has a preset width w1 and a preset depth d1. Then, with reference to FIGS. 4D and 4E. FIG. 4E illustrates a cross-sectional structural diagram of FIG. 4D along BB, S60 is implemented to form a word line structure 204 in each word line trench 203.

Figure 5A:
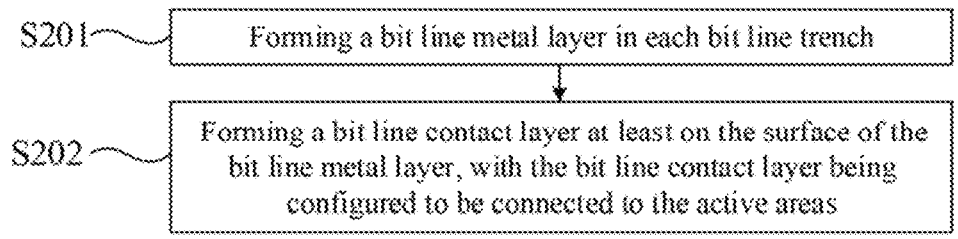
FIG. 5A illustrates a schematic flowchart of a method for forming a semiconductor structure according to embodiments of the disclosure.

According to some embodiments, with reference to FIG. 5A, the bit line structure includes a bit line metal layer and a bit line contact layer. S20 may be implemented through S201 to S202.

At S201, a bit line metal layer is formed in each bit line trench.

Herein, the material of the bit line metal layer may be a metal material, metal compound or a combination thereof. The metal material may be, e.g., tungsten, cobalt, copper, aluminum, and the metal compound may be, e.g., titanium nitride. The material of a bit line contact layer may be monocrystalline silicon, polysilicon or another conductive material.

At S202, a bit line contact layer is formed at least on the surface of the bit line metal layer, with the bit line contact layer being configured to be connected to an active area.

Herein, the material of the bit line contact layer may be monocrystalline silicon, polysilicon or another conductive material.

S201 and S202 will be illustrated with reference to FIG. 5B. A bit line structure 202 includes a bit line metal layer 2021 and a bit line contact layer 2022. Then, the operation of forming a bit line structure 202 in each bit line trench (with reference to a bit line trench 201 shown in FIG. 2B) includes: forming a bit line metal layer 2021 in each bit line trench 201, and forming a bit line contact layer 2022 at least on the surface of the bit line metal layer 2021. The bit line contact layer 2022 is configured to be connected to an active area 2001, therefore the bit line structure 202 is electrically connected to the active area 2001. When the semiconductor structure includes a transistor, the active area 2001 is provided with a source/drain region and the bit line structure 202 is electrically connected to the source/drain region through the bit line contact layer 2022.

According to the embodiment, the bit line structure is a double-layer structure of the bit line metal layer and the bit line contact layer, thereby reducing the resistance of the bit line structure and improving conductivity of the bit line structure.

Figure 5B:
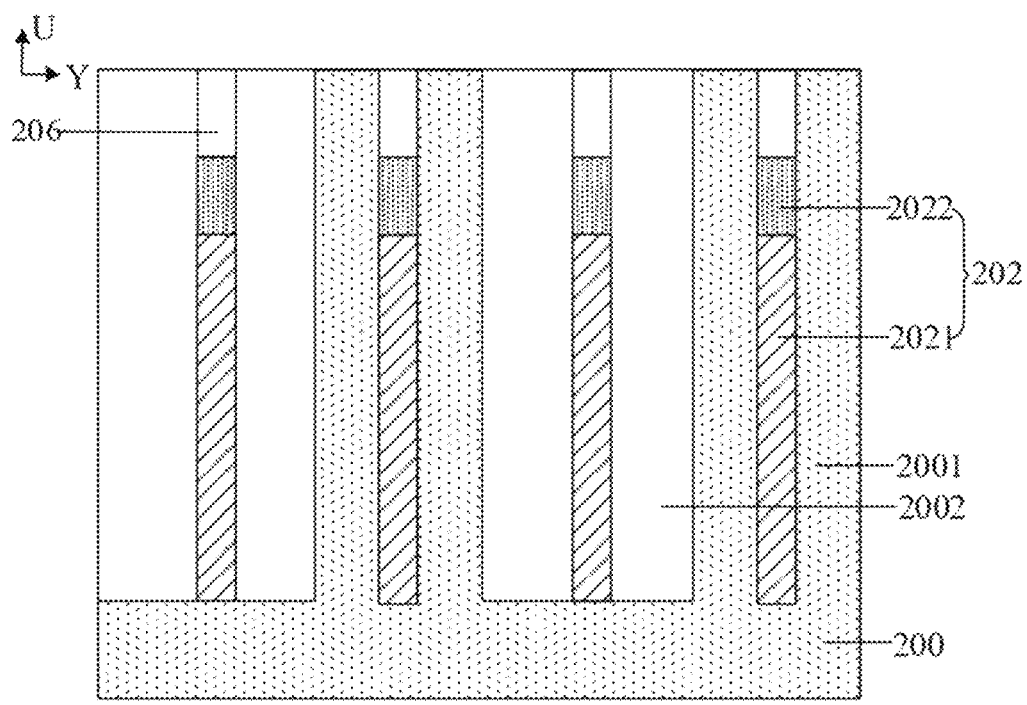
FIG. 5B illustrates a schematic structural diagram of forming a semiconductor structure according to embodiments of the disclosure.

According to some embodiments, with further reference to FIG. 5B, a method for forming a semiconductor structure, after S202, includes S203 including: forming a cover layer 206 on a bit line contact layer 2022. Herein, the material of the cover layer 206 may be silicon nitride, the upper surface of the cover layer 206 is flush with the surface of an active area 2001, and the cover layer 206 is configured to protect the bit line contact layer 2022 from damage in subsequent processes that affects the performance of a bit line structure 202 or even disables it.

Figure 6A:
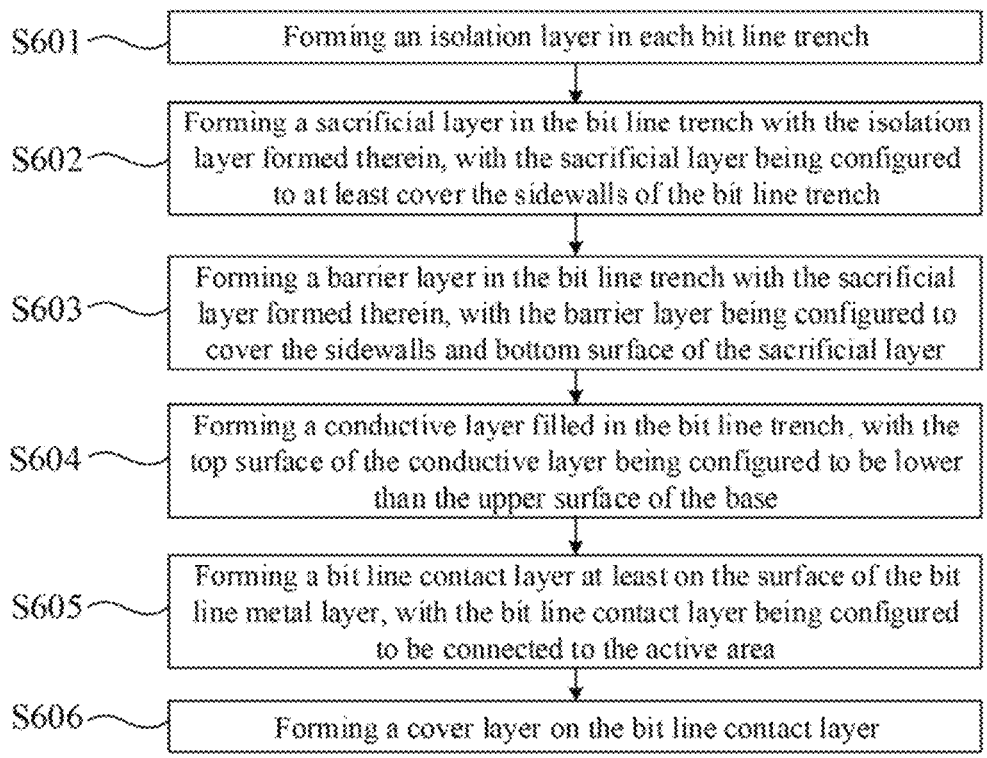
FIG. 6A illustrates a schematic flowchart of a method for forming a semiconductor structure according to embodiments of the disclosure.

According to some embodiments, a bit line metal layer includes a bit line barrier layer, and a conductive layer. With reference to FIG. 6A, S20 may further be implemented through S601 to S606.

At S601, an isolation layer is formed in each bit line trench.

Herein, the isolation layer is configured to isolate a bit line structure and a base, and the material of the isolation layer may be silicon nitride.

At S602, a sacrificial layer is formed in the bit line trench with the isolation layer formed therein, with the sacrificial layer being configured to at least cover the sidewalls of the bit line trench.

Herein, the material of the sacrificial layer may be the same as that of the isolation layer, i.e., the material may also be silicon nitride. The sacrificial layer may cover the sidewalls and bottom of the bit line trench, or may merely cover the sidewalls of the bit line trench. In other words, the sacrificial layer may be understood as the sidewalls of the bit line metal layer.

At S603, a bit line barrier layer is formed in the bit line trench with the sacrificial layer formed therein, with the bit line barrier layer being configured to cover the sidewalls and bottom surface of the sacrificial layer.

Herein, the bit line barrier layer is configured to protect an active area and prevent a material configured to form a conductive layer from contaminating the active area and causing a device to fail. The material of the bit line barrier layer may be titanium nitride.

At S604, a conductive layer is formed; the conductive layer is filled in the bit line trench, with the top surface of the conductive layer being configured to be lower than the upper surface of the base.

Herein, the material of the conductive layer may be tungsten, cobalt, copper, aluminum, or another suitable material.

At S605, a bit line contact layer is formed at least on the surface of the bit line metal layer, with the bit line contact layer being configured to be connected to an active area.

Therefore, each bit line trench includes a three-layer structure of the isolation layer, the bit line metal layer and the bit line contact layer sequentially from bottom to top, and the bit line metal layer includes a sandwich structure of the sacrificial layer, the bit line barrier layer and the conductive layer sequentially from the sidewall to the inside of the bit line trench. Therefore, the surface of the bit line metal layer in S605 refers to the upper surface of the bit line metal layer, including end surfaces of the sacrificial layer, the bit line barrier layer and the conductive layer.

At S606, a cover layer is formed on the bit line contact layer.

The foregoing S601 to S606 will be illustrated below with reference to FIG. 6B to FIG. 6E.

Figure 6B:
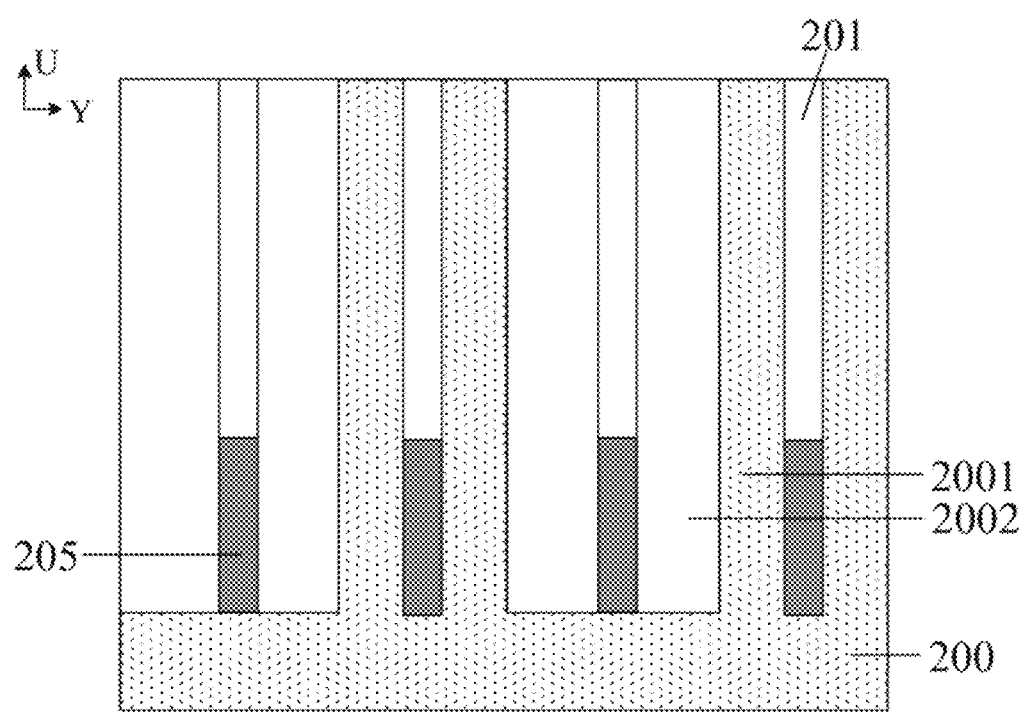
FIG. 6B illustrates a schematic structural diagram of forming a semiconductor structure according to embodiments of the disclosure.
Figure 6C:
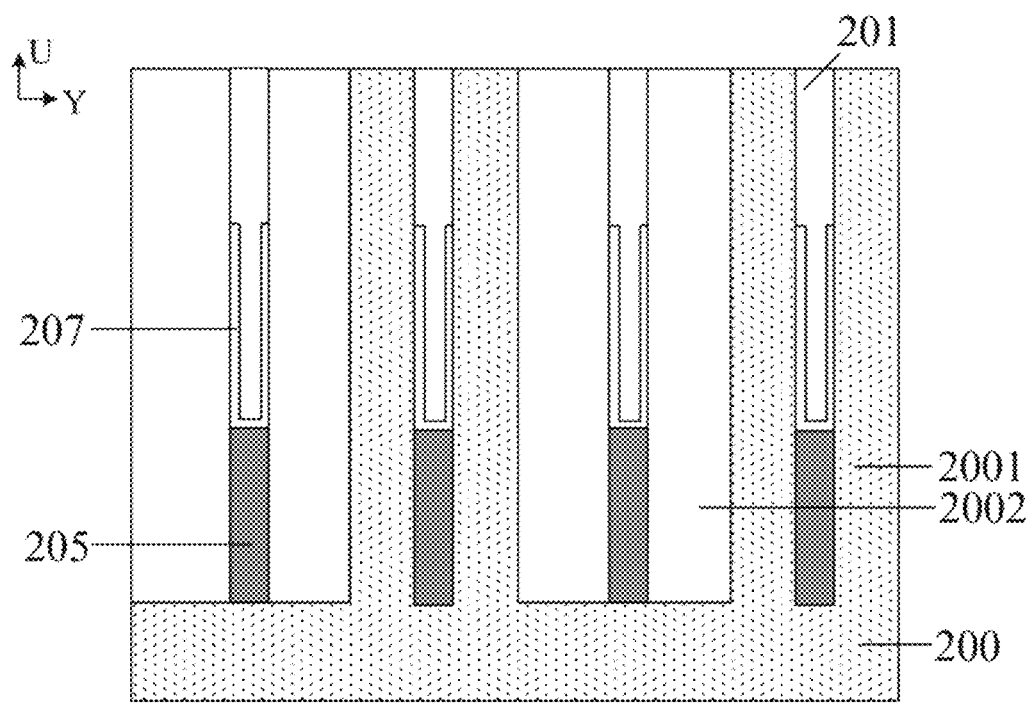
FIG. 6C illustrates a schematic structural diagram of forming a semiconductor structure according to embodiments of the disclosure.

With reference to FIG. 6B, S601 is implemented to deposit and form an isolation layer 205 in a bit line trench 201. With reference to FIG. 6C, S602 is implemented to form a sacrificial layer 207 in the bit line trench 201 with the isolation layer 205 formed therein, and the sacrificial layer 207 is configured to cover the sidewalls and bottom of the bit line trench 201.

Figure 6D:
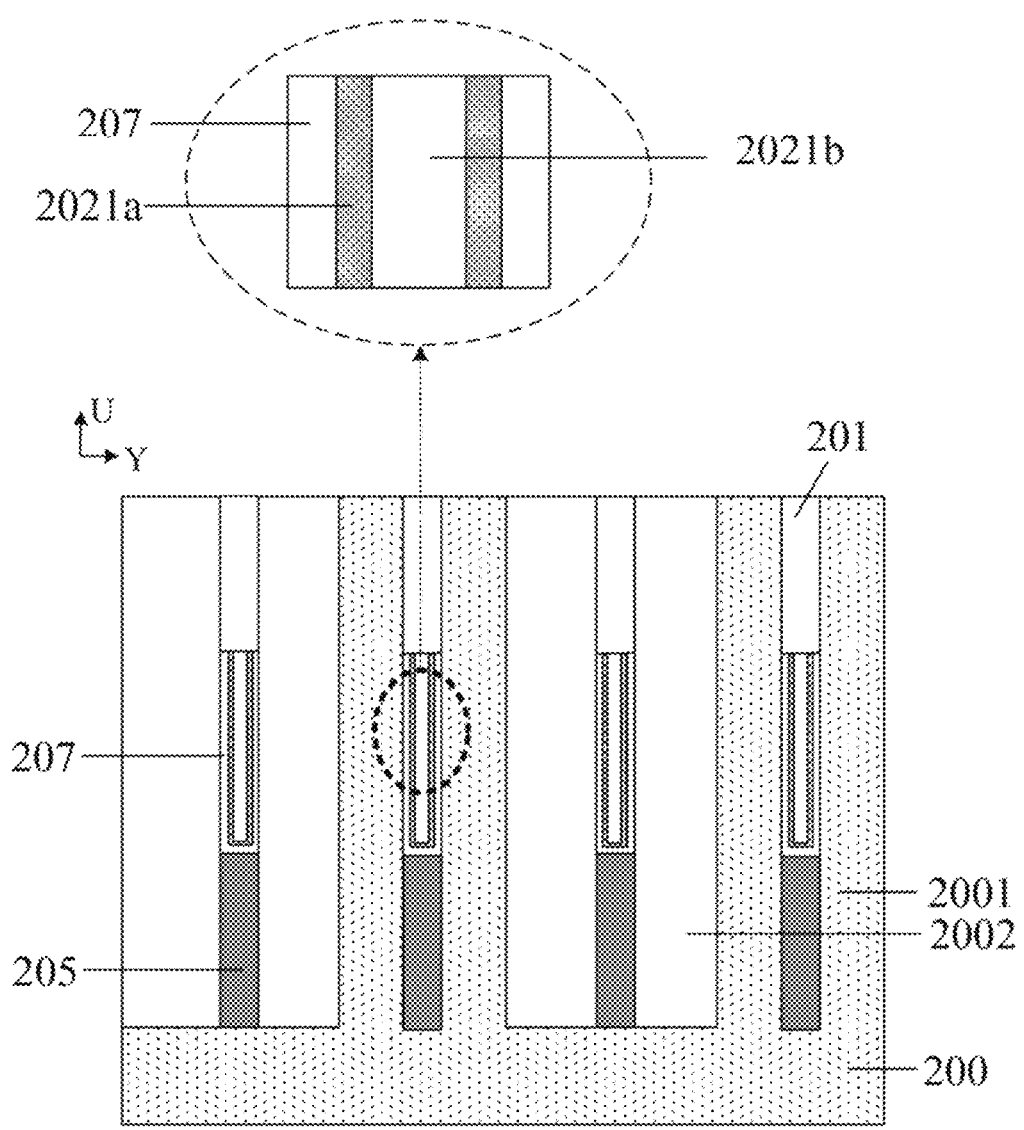
FIG. 6D illustrates a schematic structural diagram of forming a semiconductor structure according to embodiments of the disclosure.

With reference to FIG. 6D, S603 and S604 are implemented to form a bit line barrier layer 2021a configured to cover the sidewalls and bottom surface of the sacrificial layer 207 in the bit line trench 201 with the sacrificial layer 207 formed therein, and form a conductive layer 2021b filled in the bit line trench 201, and the top surface of the conductive layer 2021b is configured to be lower than the upper surface of the base (with reference to the base 20 shown in FIG. 2B).

Figure 6E:
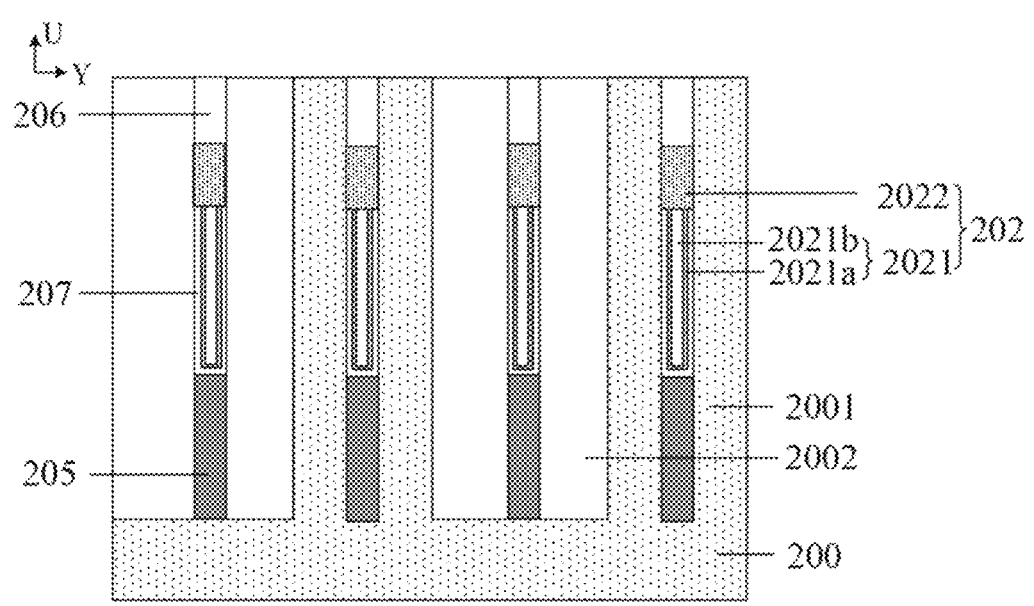
FIG. 6E illustrates a schematic structural diagram of forming a semiconductor structure according to embodiments of the disclosure.

With reference to FIG. 6E, S605 and S606 are implemented to form a bit line contact layer 2022 configured to be connected to an active area 2001 on the surface of the bit line metal layer 2021, and form a cover layer 206 on the bit line contact layer 2022. Herein, the bit line metal layer 2021 includes the bit line barrier layer 2021a and the conductive layer 2021b.

A semiconductor structure shown in FIG. 6E is formed based on S601 to S606. In the semiconductor structure according to the embodiments of the disclosure, the bit line structure 202 includes the bit line metal layer 2021 and the bit line contact layer 2022, and the semiconductor structure further includes: the isolation layer 205 in contact with and below the bit line metal layer 2021, and the cover layer 206 on the surface of the bit line contact layer 2022.

According to some embodiments, S50 of etching each active area, isolation region and bit line structure by a preset width and a preset depth to form a plurality of word line trenches arranged in a first direction and extending in a second direction, includes:

etching each active area, isolation region and bit line structure by a preset width and a preset depth with the surface of a cover layer as a start point, and at least the surface of a bit line contact layer in contact with a bit line metal layer as an end point, and retaining partial bit line metal layer with a preset thickness to form a plurality of word line trenches arranged in the first direction and extending in the second direction.

Herein, the word line trenches may be formed through wet etching or dry etching. The preset depth is equal to the thickness of the cover layer, or the preset depth is larger than the sum of the thickness of the cover layer and that of the bit line contact layer, and the preset depth is smaller than the sum of the thickness of the bit line metal layer, that of the bit line contact layer and that of the cover layer. In other words, the bottom surface of each word line trench may be flush with the top surface of the bit line metal layer, and the bottom surface of each word line trench may also be lower than the top surface of the bit line metal layer and higher than the bottom surface of the bit line metal layer.

Figure 6F:
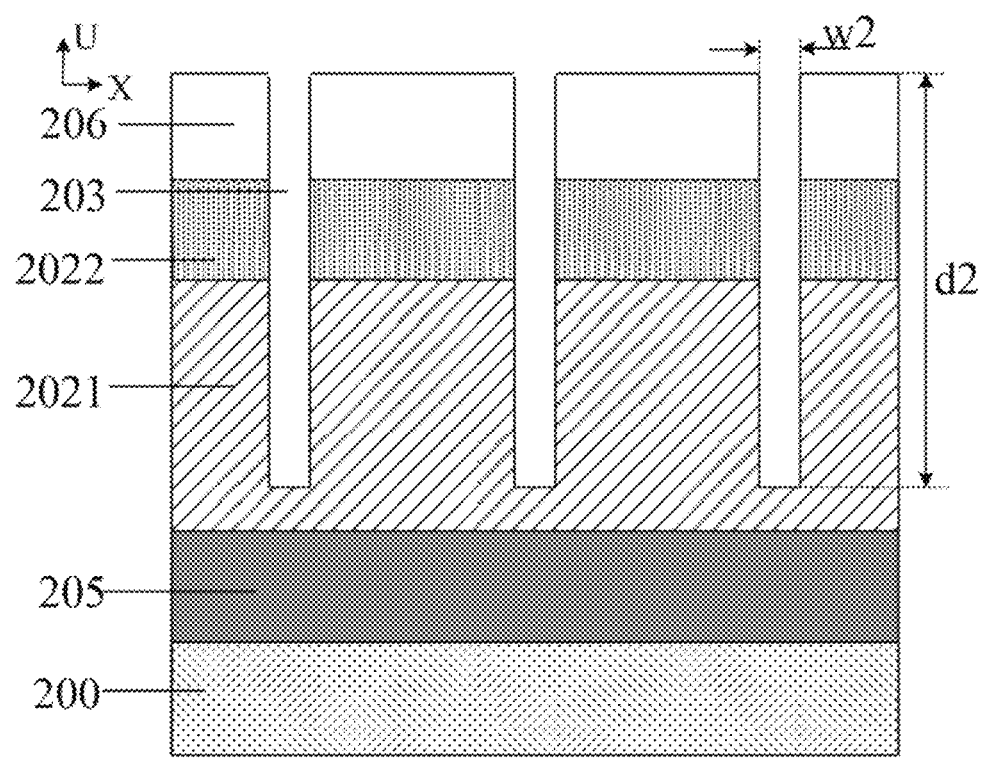
FIG. 6F illustrates a schematic structural diagram of forming a semiconductor structure according to embodiments of the disclosure.

The foregoing operations will be illustrated with reference to FIG. 6F. Each active area 2001, isolation region 2002, and bit line structure 202 are etched with the surface of a cover layer 206 as a start point and a point at a bit line metal layer 2021 as an end point to form a plurality of word line trenches 203 parallel to each other and with a preset depth d2 and a preset width w2.

According to the embodiment, partial bit line metal layer with a preset thickness is retained, thereby ensuring the normal function of the bit line structure.

Figure 7A:
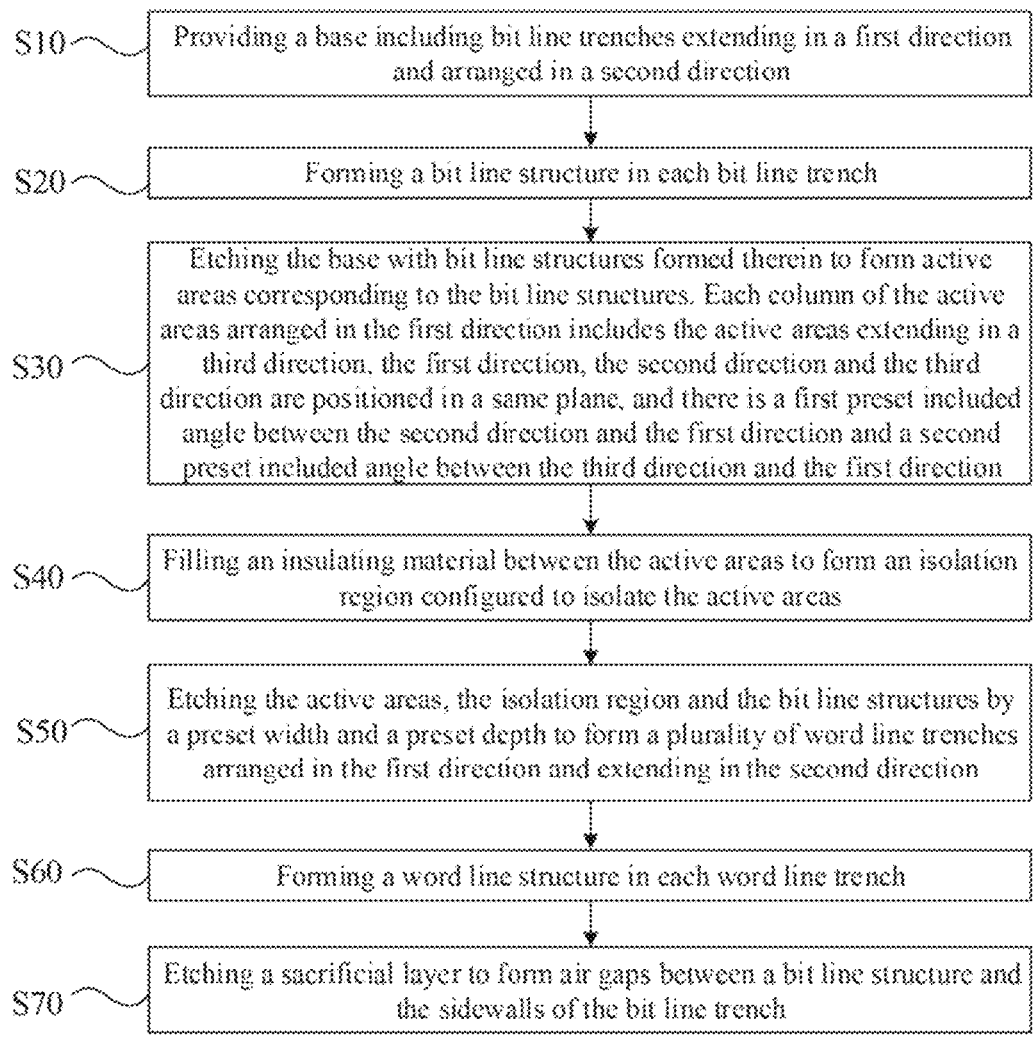
FIG. 7A illustrates another schematic flowchart of a method for forming a semiconductor structure according to embodiments of the disclosure.

According to some embodiments, with reference to FIG. 7A, after forming a plurality of word line trenches arranged in the first direction, a method for forming a semiconductor structure further includes S70, including: etching a sacrificial layer to form air gaps between a bit line structure and the sidewalls of a bit line trench. Herein, the sacrificial layer may be etched through wet etching.

Figure 7B:
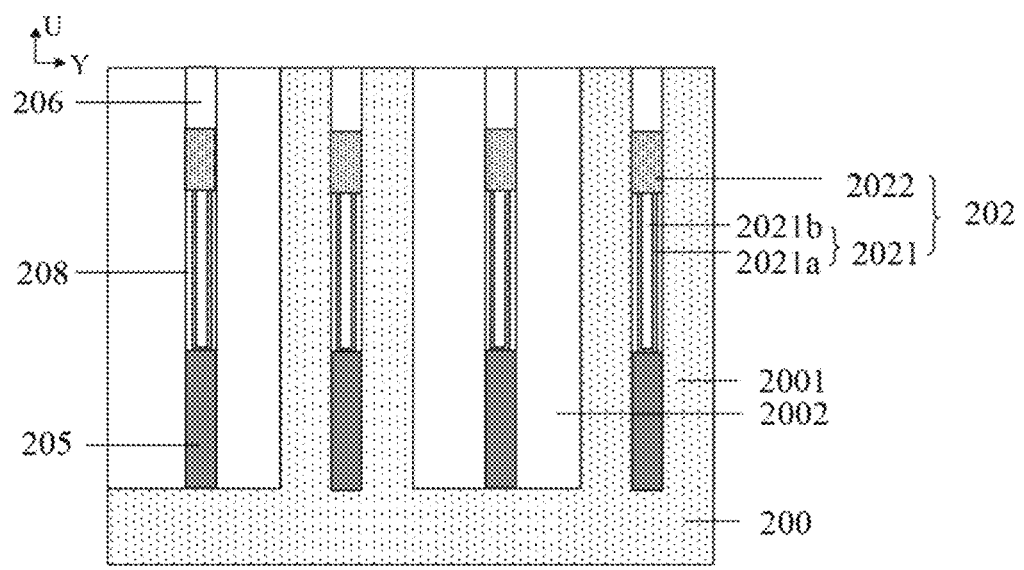
FIG. 7B illustrates a schematic structural diagram of forming a semiconductor structure according to embodiments of the disclosure.

With reference to FIG. 7B, a sacrificial layer 207 is etched to form air gaps 208 between a bit line structure 202 and the sidewalls of a bit line trench 201. There may be parasitic capacitance among a plurality of bit line structures 202, especially between adjacent bit line structures 202. The sacrificial layer 207 may be configured to be an insulator, the permittivity of which is usually larger than 1. Due to the fact that, the permittivity of air is generally considered to be approximately equal to 1, etching a sacrificial layer 207, and forming air gaps 208 between a bit line structure 202 and the sidewalls of a bit line trench 201 may reduce the permittivity of a dielectric layer between each bit line structure 202 and an active area 2001, and between each bit line structure 202 and an isolation region, and among a plurality of bit line structures 202, on the premise that a bit line metal layer 2021 is insulated from a base 20, thereby reducing the parasitic capacitance between each bit line structure 202 and the corresponding active area 2001, between each bit line structure 202 and the corresponding isolation region, and among a plurality of bit line structures 202.

A semiconductor structure shown in FIG. 7B is formed based on the method for forming the semiconductor structure shown in FIG. 7A. According to some embodiments, with reference to FIG. 7B, a semiconductor structure further includes air gaps 208 formed on the sidewall of a bit line metal layer 2021.

Figure 7C:
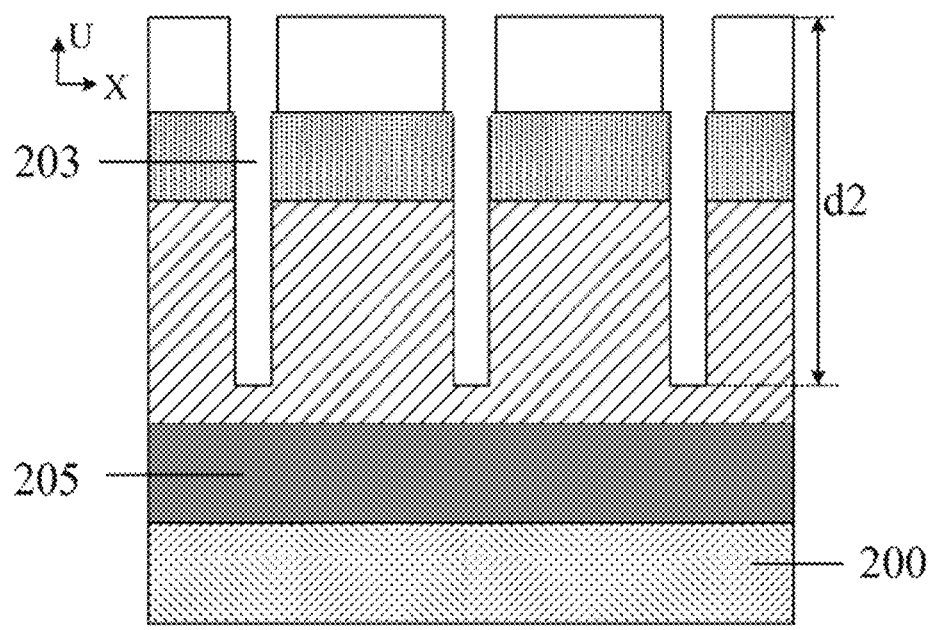
FIG. 7C illustrates a schematic structural diagram of forming a semiconductor structure according to embodiments of the disclosure.

Further, with reference to FIG. 7C, when a sacrificial layer 207 is etched and the material of a cover layer 206 is the same as or similar to that of an isolation layer 205, partial surface of the cover layer 206 is etched.

Figure 8A:
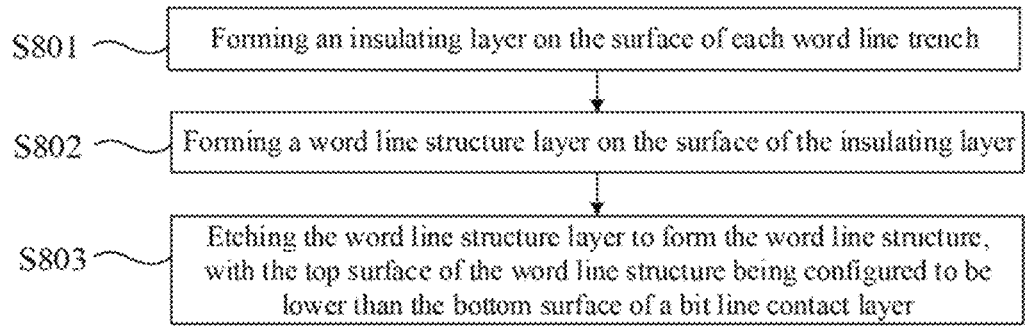
FIG. 8A illustrates a schematic flowchart of a method for forming a semiconductor structure according to embodiments of the disclosure.

According to some embodiments, with reference to FIG. 8A, S60 of forming a word line structure in each word line trench, may include the following operations.

At S801, an insulating layer is formed on the surface of each word line trench.

Herein, the insulating layer is configured to be a gate oxide layer of the word line structure and the material of the insulating layer may include one or more of silicon oxides, e.g., silicon dioxide. The insulating layer may be formed through any suitable deposition process, e.g., a CVD process, PVD process or ALD process.

At S802, a word line structure layer is formed on the surface of the insulating layer.

Herein, the word line structure layer may include a word line barrier layer and a word line metal layer, and the word line barrier layer is configured to improve the adhesion between the word line metal layer and another structure, the material of the word line barrier layer may be titanium nitride, and the material of the word line metal layer may be tungsten.

At S803, the word line structure layer is etched to form the word line structure, with the top surface of the word line structure being configured to be lower than the bottom surface of a bit line contact layer.

The foregoing S801 to S803 will be illustrated below with reference to FIG. 8B to FIG. 8D.

Figure 8B:
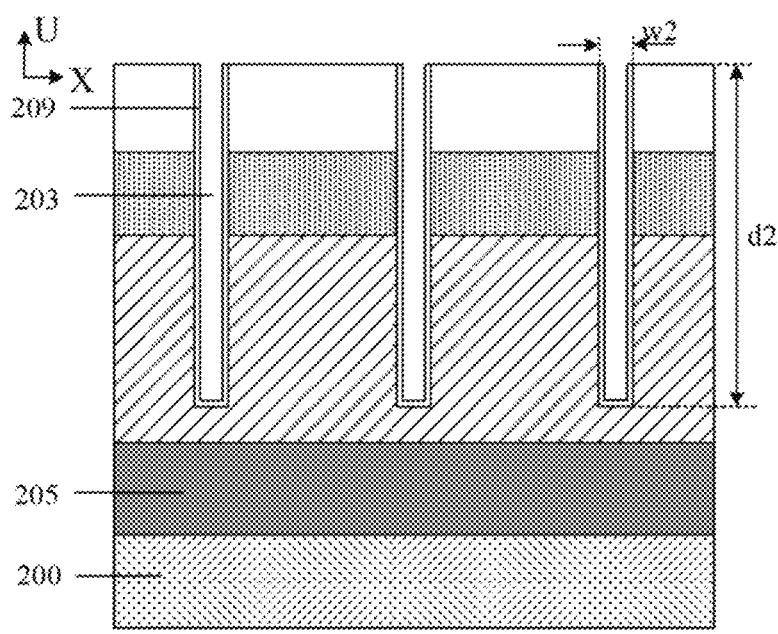
FIG. 8B illustrates a schematic structural diagram of forming a semiconductor structure according to embodiments of the disclosure.
Figure 8C:
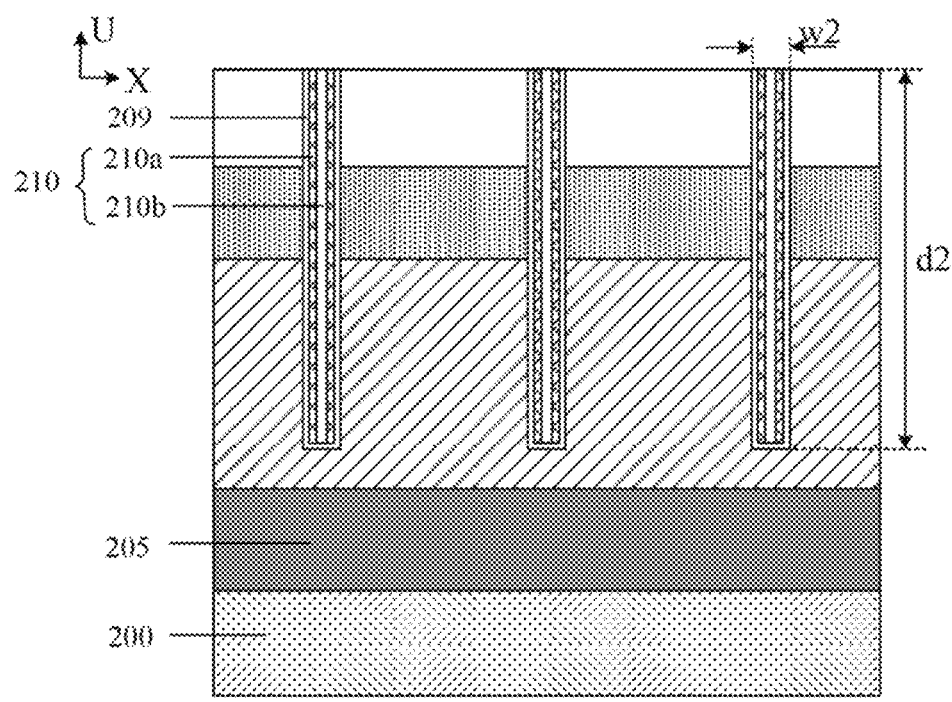
FIG. 8C illustrates a schematic structural diagram of forming a semiconductor structure according to embodiments of the disclosure.

With reference to FIG. 8B, S801 is implemented to form an insulating layer 209 on the surface of each word line trench 203. S802 is implemented to form a word line structure layer 210 shown in FIG. 8C on the surface of the insulating layer 209. The word line structure layer 210 may include a word line barrier layer 210a and a word line metal layer 210b. S803 is implemented to etch the word line structure layer 210 to form a word line structure 204 shown in FIG. 8D, and the top surface of the word line structure 204 is configured to be lower than the bottom surface of a bit line contact layer 2022.

According to some embodiments, after S60, a method for forming a semiconductor structure further includes: forming a word line protection structure on the surface of a word line structure. With reference to FIG. 8E, a word line protection structure 215 is formed on the surface of a word line structure 204.

According to some embodiments, S803 includes: etching a word line structure layer with the surface of the word line structure layer as a start point and ⅓ to ⅔ of the thickness of a bit line metal layer as an end point to form a word line structure. As shown in FIG. 8D, the top surface of a word line structure 204 is lower than the top surface of a bit line metal layer 2021, and the distance between the top surface of the word line structure 204 and that of the bit line metal layer 2021 is ⅓ of the thickness of the bit line metal layer 2021.

According to the embodiment, the cross-sectional area of the word line structure is increased by setting the end point of etching when the word line structure is formed. Due to the fact that, the larger the cross-sectional area of the word line structure is, the smaller the resistance is, the formed word line structure has relatively small resistance. Further, the overlapping area between the word line structure and a bit line structure may be reduced without cutting off the bit line structure, thereby reducing the parasitic capacitance.

Figure 8D:
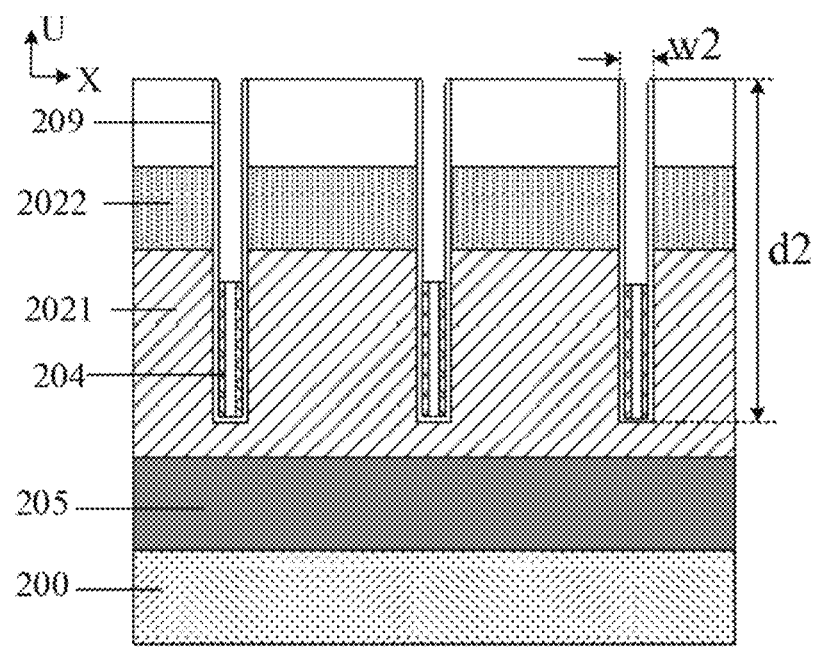
FIG. 8D illustrates a schematic structural diagram of forming a semiconductor structure according to embodiments of the disclosure.
Figure 8E:
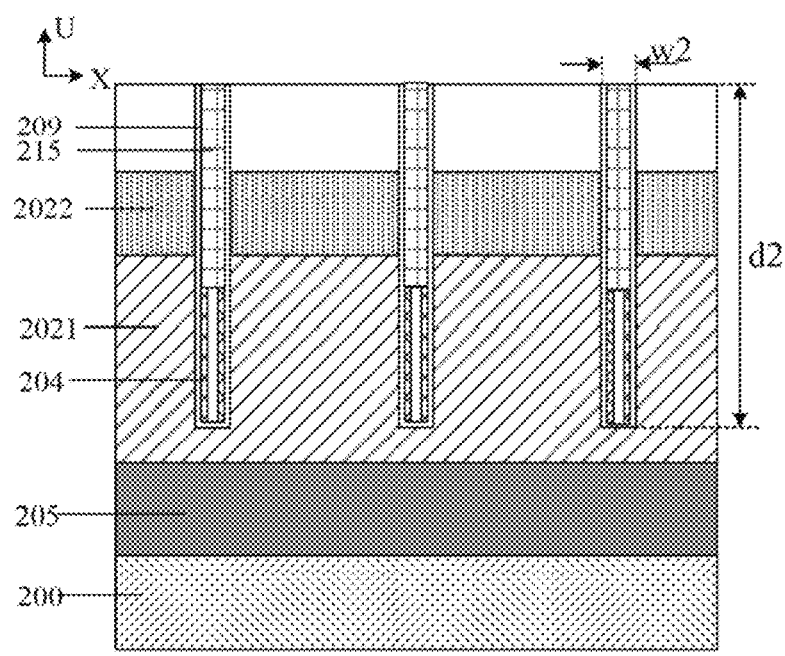
FIG. 8E illustrates a schematic structural diagram of forming a semiconductor structure according to embodiments of the disclosure.

According to some embodiments, with reference to FIG. 8D, a semiconductor structure further includes: a plurality of word line structures 204 extending in a second direction (Y-axis direction) and arranged in a first direction (X-axis direction).

The bottom surface of each word line structure 204 is positioned at ⅓ to ⅔ of the height of a bit line metal layer 2021.

The top surface of each word line structure 204 is lower than the surface of the bit line metal layer 2021 in contact with a bit line contact layer 2022.

Figure 9A:
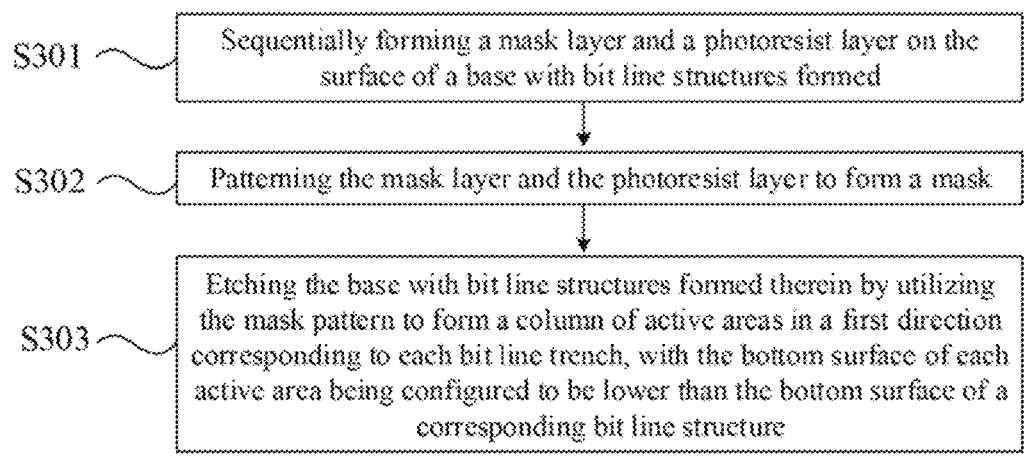
FIG. 9A illustrates a schematic flowchart of a method for forming a semiconductor structure according to embodiments of the disclosure.

According to some embodiments, with reference to FIG. 9A, S30 is implemented through S301 to S303.

At S301, a mask layer and a photoresist layer are sequentially formed on the surface of a base with bit line structures formed therein.

Herein, the mask layer may have a double-layer structure, or may also have a single-layer structure. The material of the mask layer may be at least one of silicon oxide, silicon nitride, silicon carbide, silicon oxynitride, amorphous carbon, polysilicon, hafnium oxide, titanium oxide, zirconia, titanium nitride, tantalum nitride or titanium. The mask layer may be formed through any of the following processes: a CVD process, PVD process, ALD process, spin coating process or any other suitable process.

At S302, the mask layer and the photoresist layer are patterned to form a mask pattern.

Herein, patterning refers to enabling the photoresist layer and the mask layer to have the mask pattern through a photoetching process, and the mask pattern defines the position of an active area.

At S303, the base with bit line structures formed therein is etched by utilizing the mask pattern to form a column of active areas in a first direction corresponding to each bit line trench, with the bottom surface of each active area being configured to be lower than the bottom surface of corresponding bit line structure.

Figure 9B:
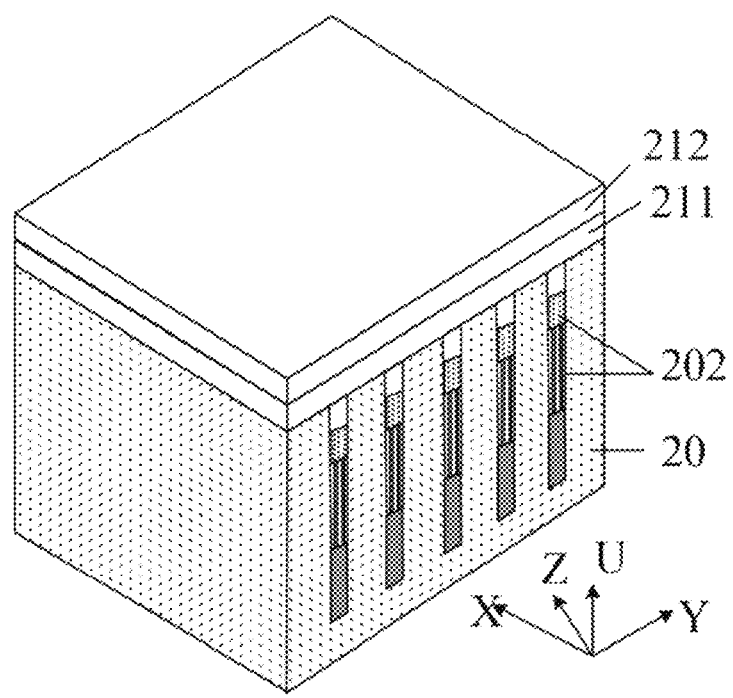
FIG. 9B illustrates a schematic structural diagram of forming a semiconductor structure according to embodiments of the disclosure.

The S301 to S303 will be illustrated below with reference to FIG. 9B to FIG. 9D. With reference to FIG. 9B, a mask layer 211 and a photoresist layer 212 are sequentially formed on the surface of a base 20 with bit line structures 202 formed therein. Further with reference to FIG. 9B, the mask layer 211 and the photoresist layer 212 are patterned to form a mask pattern 213 shown in FIG. 9C. Further with reference to FIG. 9C, the base 20 with bit line structures 202 formed therein is etched by utilizing the mask pattern 213, partial base 20 protected by the mask pattern 213 is retained during etching, and partial base 20 not protected by the mask pattern 213 is etched, and finally a plurality of active areas 2001 isolated from each other shown in FIG. 9D are formed. The plurality of active areas 2001 are divided into a plurality of columns, and each bit line structure 202 corresponds to a column of active areas 2001 in the X-axis direction. The bottom surface of any active area 2001 is lower than the bottom surface of the corresponding bit line structure 202.

Figure 10A:
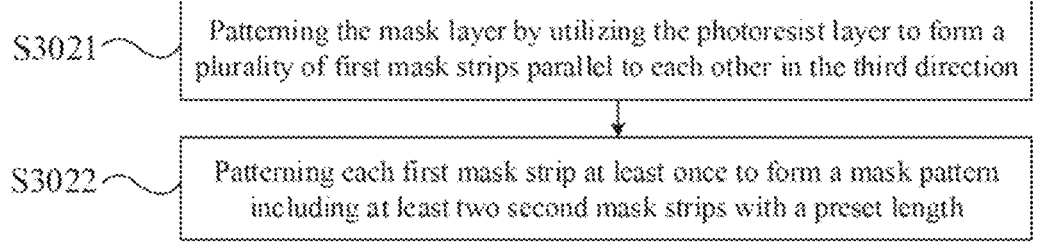
FIG. 10A illustrates a schematic flowchart of a method for forming a semiconductor structure according to embodiments of the disclosure.

According to some embodiments, with reference to FIG. 10A, S302 may be implemented through S3021 and S3022.

At S3021, a mask layer is patterned by utilizing a photoresist layer to form a plurality of first mask strips parallel to each other in a third direction.

At S3022, each first mask strip is patterned at least once to form a mask pattern including at least two second mask strips with a preset length.

Herein, the length of the first mask strips is larger than that of the second mask strips.

The S3021 to S3022 will be illustrated below with reference to FIG. 9B, FIG. 10B, and FIG. 9C.

Figure 10B:
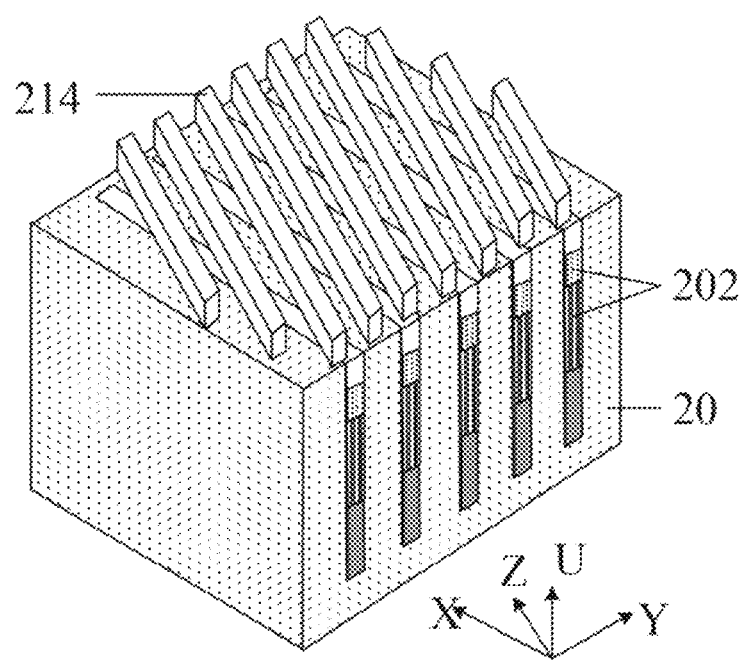
FIG. 10B illustrates a schematic structural diagram of forming a semiconductor structure according to embodiments of the disclosure.

With reference to FIG. 9B, a photoresist layer 212 is exposed, developed, washed, etc., and a mask layer 211 is etched by utilizing the retained partial photoresist layer 212 to retain partial mask layer 211 protected by the photoresist layer 212 to form a plurality of first mask strips 214 parallel to each other and extending in the Z-axis direction shown in FIG. 10B. The direction in which the first mask strips 214 extend is the direction in which subsequently formed active areas 2001 extend.

Figure 9C:
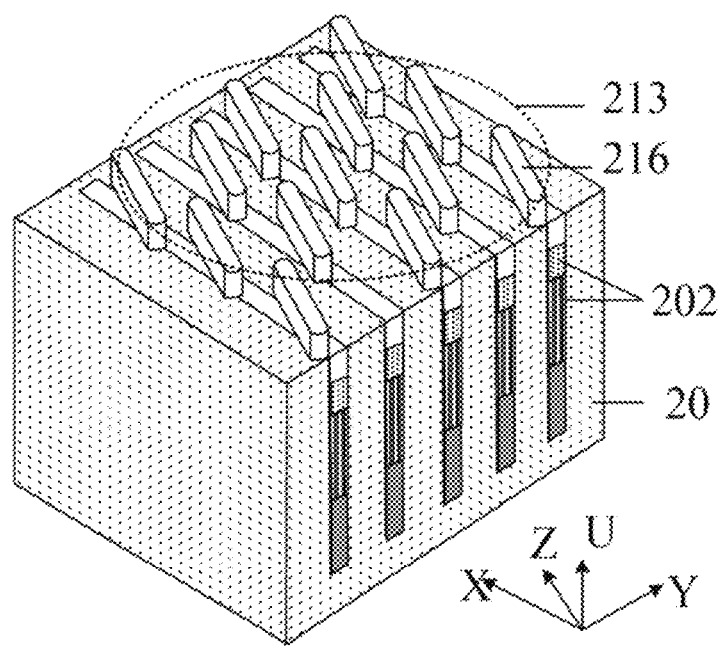
FIG. 9C illustrates a schematic structural diagram of forming a semiconductor structure according to embodiments of the disclosure.
Figure 9D:
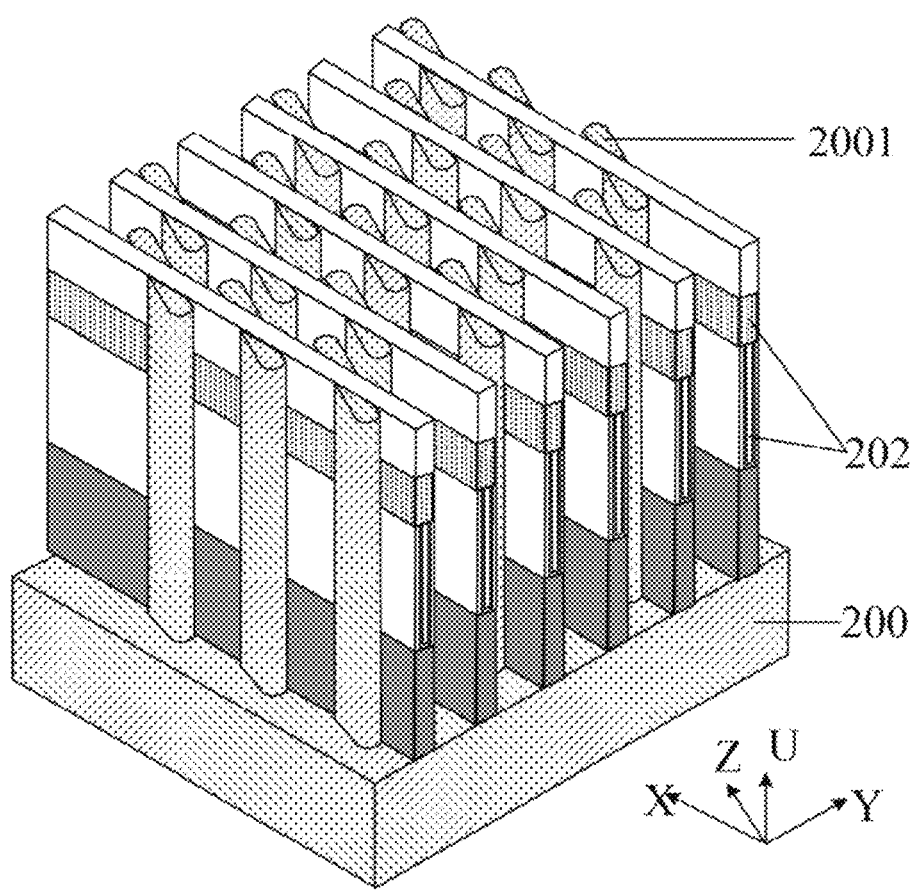
FIG. 9D illustrates a schematic structural diagram of forming a semiconductor structure according to embodiments of the disclosure.

With reference to FIG. 10B, the first mask strips 214 are patterned at least once and the first mask strips 214 are cut off to form a mask pattern 213 shown in FIG. 9C. By doing so, each mask pattern 213 includes at least two second mask strips 216 with a preset length. Exemplarily, first mask strips 214 are sequentially etched with a first cutting photomask and a second cutting photomask to form a plurality of second mask strips 216 configured to form a mask pattern 213. The preset length of the second mask strips 216 is the length of active areas 2001.

Features disclosed according to the method embodiments or semiconductor structure embodiments of the disclosure may be combined on a non-conflict basis to obtain new method embodiments or semiconductor structure embodiments.

The foregoing description of the semiconductor structure embodiments is similar to that of the method embodiments and similar advantages are shared. Technical details not disclosed according to the semiconductor embodiments of the disclosure should be understood with reference to the description of the method embodiments of the disclosure.

The foregoing description merely illustrates illustrative embodiments of the disclosure, and is not intended to limit the scope of the disclosure. Any modification, equivalent replacement, improvement, etc. derived within the spirit and principles of the disclosure should fall within the scope of the disclosure. Therefore, the scope of the embodiments of the disclosure shall be defined by the scope of claims.

INDUSTRIAL APPLICABILITY

According to the embodiments of the disclosure, bit line structures are formed in a base with bit line trenches formed therein, and then, the base is etched to form active areas, thereby providing a method for forming a semiconductor structure different from that in the related art. In the related art, active areas are formed first and then bit line structures are formed. According to the technical scheme according to the embodiments of the disclosure, the bit line structures are formed first and then the active areas are formed. Therefore, according to the technical scheme according to the embodiments of the disclosure, filling and a plurality of etching processes are not required, thereby simplifying the process for forming the semiconductor structure.

What is claimed is:

1. A method for forming a semiconductor structure, comprising:
providing a base comprising bit line trenches, the bit line trenches extending in a first direction and being arranged in a second direction;
forming a bit line structure in each of the bit line trenches; and
etching the base with bit line structures formed therein to form active areas corresponding to the bit line structures,
wherein each column of the active areas arranged in the first direction comprises the active areas extending in a third direction, the first direction, the second direction and the third direction are positioned in a same plane, and there is a first preset included angle between the second direction and the first direction and a second preset included angle between the third direction and the first direction.

2. The method of claim 1, further comprising:
filling an insulating material between the active areas to form an isolation region, wherein the isolation region is configured to isolate the active areas.

3. The method of claim 2, further comprising:
etching the active areas, the isolation region and the bit line structures by a preset width and a preset depth to form a plurality of word line trenches arranged in the first direction and extending in the second direction; and
forming a word line structure in each of the word line trenches.

4. The method of claim 3, wherein each of the bit line structures comprises a bit line metal layer and a bit line contact layer; and wherein the forming a bit line structure in each of the bit line trenches comprises:
forming the bit line metal layer in each of the bit line trenches; and
forming the bit line contact layer at least on a surface of the bit line metal layer, wherein the bit line contact layer is configured to be connected to the active areas.

5. The method of claim 4, wherein before the forming the bit line metal layer in each of the bit line trenches, the method further comprises:
forming an isolation layer in each of the bit line trenches; and wherein after the forming the bit line contact layer at least on a surface of the bit line metal layer, the method further comprises:
forming a cover layer on the bit line contact layer.

6. The method of claim 5, wherein the bit line metal layer comprises a bit line barrier layer and a conductive layer, and the method further comprises:
forming a sacrificial layer in the bit line trenches with the isolation layer formed therein, wherein the sacrificial layer is configured to cover sidewalls and a bottom surface of each of the bit line trenches;
and wherein the forming the bit line metal layer in each of the bit line trenches comprises:
forming the bit line barrier layer in the bit line trenches with the sacrificial layer formed therein, wherein the bit line barrier layer is configured to cover sidewalls and a bottom surface of the sacrificial layer; and
forming a conductive layer filled in the bit line trenches, wherein a top surface of the conductive layer is lower than an upper surface of the base.

7. The method of claim 5, wherein the etching the active areas, the isolation region and the bit line structures by a preset width and a preset depth to form a plurality of word line trenches arranged in the first direction and extending in the second direction comprises:
etching the active areas, the isolation region and the bit line structures by the preset width and the preset depth, with a surface of the cover layer as a start point, and at least a surface of the bit line metal layer in contact with the bit line contact layer as an end point, and retaining the bit line metal layer with a preset thickness to form the plurality of word line trenches arranged in the first direction and extending in the second direction.

8. The method of claim 6, wherein after forming the plurality of word line trenches arranged in the first direction, the method further comprises:
   etching the sacrificial layer to form air gaps between the bit line structure and sidewalls of a corresponding bit line trench.

9. The method of claim 4, wherein the forming a word line structure in each of the word line trenches comprises:
   forming an insulating layer on a surface of each of the word line trenches;
   forming a word line structure layer on a surface of the insulating layer; and
   etching the word line structure layer to form the word line structure, wherein a top surface of the word line structure is lower than a bottom surface of the bit line contact layer.

10. The method of claim 9, wherein the etching the word line structure layer to form the word line structure comprises:
   etching the word line structure layer with a surface of the word line structure layer as a start point and $1/3$-$2/3$ of a thickness of the bit line metal layer as an end point to form the word line structure.

11. The method of claim 1, wherein the etching the base with bit line structures formed therein to form active areas corresponding to the bit line structures comprises:
   sequentially forming a mask layer and a photoresist layer on a surface of the base with the bit line structures formed therein;
   patterning the mask layer and the photoresist layer to form a mask pattern; and
   etching the base with the bit line structures formed therein by utilizing the mask pattern to form a column of the active areas in the first direction corresponding to each of the bit line trenches, wherein a bottom surface of an active area is lower than a bottom surface of a corresponding bit line structure.

12. The method of claim 11, wherein the patterning the mask layer and the photoresist layer to form a mask pattern comprises:
   simultaneously etching the mask layer and the photoresist layer to form a plurality of first mask strips parallel to each other along the third direction; and
   patterning each of the first mask strips at least once to form the mask pattern, wherein the mask pattern comprises at least two second mask strips with a preset length.

13. The method of claim 3, wherein after the forming a word line structure in each of the word line trenches, the method further comprises:
   forming a word line protection structure on a surface of each of the word line structures.

* * * * *